United States Patent
Aonuma et al.

(10) Patent No.: US 9,356,253 B2
(45) Date of Patent: May 31, 2016

(54) ORGANIC ELECTROLUMINESCENT ELEMENT AND METHOD FOR MANUFACTURING ORGANIC ELECTROLUMINESCENT ELEMENT

(71) Applicant: JOLED INC., Tokyo (JP)

(72) Inventors: Masaki Aonuma, Osaka (JP); Takuya Satoh, Kyoto (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/371,187

(22) PCT Filed: Mar. 8, 2013

(86) PCT No.: PCT/JP2013/001507
§ 371 (c)(1),
(2) Date: Jul. 9, 2014

(87) PCT Pub. No.: WO2014/020789
PCT Pub. Date: Feb. 6, 2014

(65) Prior Publication Data
US 2014/0374725 A1 Dec. 25, 2014

(30) Foreign Application Priority Data

Aug. 1, 2012 (JP) ................................ 2012-171344

(51) Int. Cl.
*H01L 51/52* (2006.01)
*H01L 51/56* (2006.01)

(52) U.S. Cl.
CPC ........ *H01L 51/5225* (2013.01); *H01L 51/5234* (2013.01); *H01L 51/56* (2013.01); *H01L 2251/305* (2013.01); *H01L 2251/308* (2013.01); *H01L 2251/55* (2013.01)

(58) Field of Classification Search
CPC .. H01L 51/5225; H01L 51/5234; H01L 51/56
See application file for complete search history.

(56) References Cited

U.S. PATENT DOCUMENTS

| 5,443,922 | A | 8/1995 | Nishizaki et al. |
| 6,255,774 | B1 | 7/2001 | Pichler |
| 6,402,579 | B1 | 6/2002 | Pichler et al. |
| 6,951,689 | B1 * | 10/2005 | Higashikawa .. H01L 31/022466 136/255 |
| 2002/0109458 | A1 | 8/2002 | Pichler et al. |
| 2003/0173893 | A1 | 9/2003 | Shibasaki et al. |
| 2003/0218153 | A1 | 11/2003 | Abe |

(Continued)

FOREIGN PATENT DOCUMENTS

| JP | 05-163488 | 6/1993 |
| JP | 2003-249357 | 9/2003 |
| JP | 2004-087451 | 3/2004 |
| JP | 2005-166671 | 6/2005 |

(Continued)

OTHER PUBLICATIONS

Jung et al. entitled "Influence of dc magnetron sputtering parameters on surface morphology of indium tin oxide thin films", Applied Surface Science 221 (2004) pp. 136-142.*

(Continued)

*Primary Examiner* — Erik Kielin
(74) *Attorney, Agent, or Firm* — Greenblum & Bernstein, P.L.C.

(57) ABSTRACT

An organic electroluminescent element including: a lower electrode; an organic functional layer on the lower electrode; and an upper electrode on the organic functional layer, wherein profile of an upper surface of the upper electrode has a skewness of between −0.5 and 0.7 inclusive.

16 Claims, 25 Drawing Sheets

(56) References Cited

U.S. PATENT DOCUMENTS

| | | |
|---|---|---|
| 2005/0116628 A1 | 6/2005 | Lee |
| 2005/0224766 A1 | 10/2005 | Abe |
| 2005/0264181 A1 | 12/2005 | Shibasaki et al. |
| 2006/0219988 A1 | 10/2006 | Abe |
| 2006/0284143 A1 | 12/2006 | Abe |
| 2007/0128465 A1* | 6/2007 | Liu et al. .................. 428/689 |
| 2011/0297917 A1 | 12/2011 | Terao |
| 2014/0077188 A1 | 3/2014 | Aonuma et al. |
| 2014/0080241 A1 | 3/2014 | Aonuma |
| 2014/0138658 A1 | 5/2014 | Aonuma |

FOREIGN PATENT DOCUMENTS

| | | |
|---|---|---|
| JP | 2005-197210 | 7/2005 |
| JP | 2005-268113 | 9/2005 |
| JP | 2007-095338 | 4/2007 |
| JP | 2010-065266 | 3/2010 |
| JP | 2011-040173 | 2/2011 |
| WO | 2011/021280 | 2/2011 |

OTHER PUBLICATIONS

International Search Report (ISR) in International Patent Application No. PCT/JP2013/001507, dated Jun. 11, 2013.

* cited by examiner

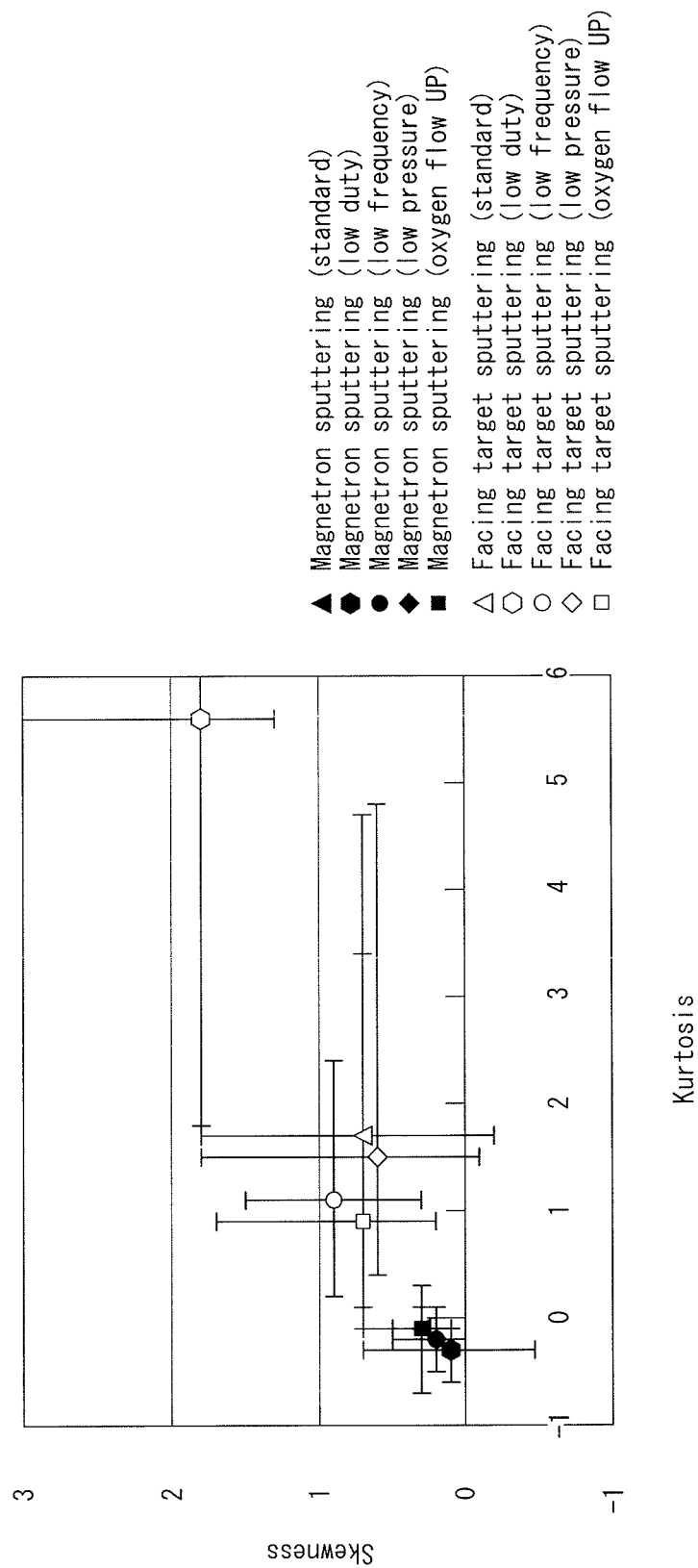

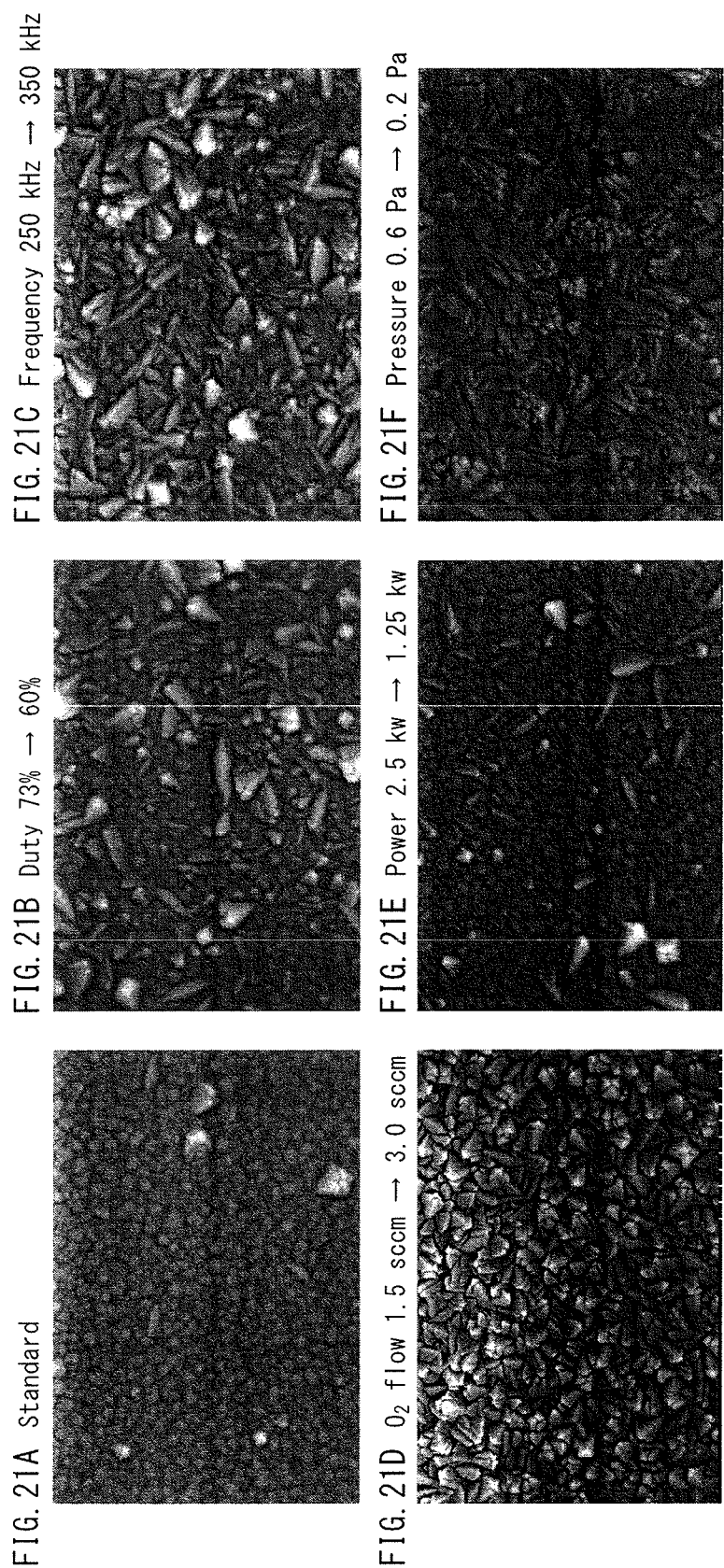

FIG. 22C Frequency 250 kHz → 100 kHz
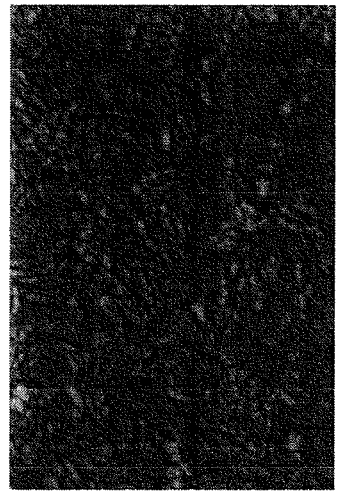
FIG. 22F Pressure 0.6 Pa → 0.5 Pa
FIG. 22B Duty 73% → 60%
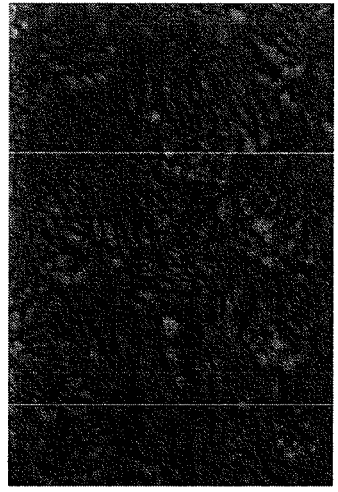
FIG. 22E Power 5.4 kw → 2.7 kw
FIG. 22A Standard
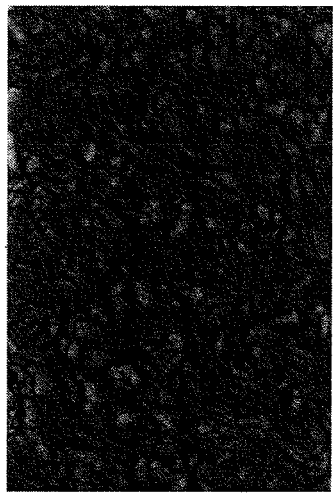
FIG. 22D O$_2$ flow 10 sccm → 15 sccm

ORGANIC ELECTROLUMINESCENT ELEMENT AND METHOD FOR MANUFACTURING ORGANIC ELECTROLUMINESCENT ELEMENT

TECHNICAL FIELD

The present invention relates to organic electroluminescent elements and methods for manufacturing organic electroluminescent elements and, in particular, to technology for forming electrodes included in organic electroluminescent elements.

BACKGROUND ART

In recent years, research and development of organic electroluminescent elements making use of electroluminescence of organic materials have progressed. The organic electroluminescent elements are highly visible due to their self-luminescence properties, and are superbly resistant to shocks due to their complete solid-state structure. As such, the organic electroluminescent elements are attracting attention as light-emitting elements and light sources for use in various display devices.

An organic electroluminescent element includes one or more organic functional layers between an upper electrode and a lower electrode, and is manufactured by sequentially stacking the lower electrode, the one or more organic functional layers, and the upper electrode by a method such as vapor deposition and sputtering (see, for example, Patent Literature 1).

CITATION LIST

Patent Literature

[Patent Literature 1]
Japanese Patent Application Publication No. 2007-95338

SUMMARY OF INVENTION

Technical Problem

A conventional organic electroluminescent element as described above, however, has insufficient device performance, such as an element lifetime and light-emitting efficiency.

The present invention has been conceived in view of the above-mentioned problem, and aims to provide an organic electroluminescent element having excellent device performance, such as an element lifetime and light-emitting efficiency.

Solution to Problem

In order to achieve the above-mentioned aim, an organic electroluminescent element as one embodiment of the present invention is an organic electroluminescent element comprising: a lower electrode; an organic functional layer on the lower electrode; and an upper electrode on the organic functional layer, wherein profile of an upper surface of the upper electrode has a skewness of between −0.5 and 0.7 inclusive.

Advantageous Effects of Invention

According to the organic electroluminescent element as one embodiment of the present invention, the profile of the upper surface of the upper electrode formed on the organic functional layer has a skewness of between −0.5 and 0.7 inclusive. Therefore, an electrode film having a high flatness and thus having few spaces therein can be formed at an interface between the organic functional layer and the upper electrode. Intrusion of oxygen and a material for an electrode into the organic functional layer can thus be suppressed, and an organic electroluminescent element having excellent device performance, such as an element lifetime and light-emitting efficiency, can be provided.

BRIEF DESCRIPTION OF DRAWINGS

FIG. 6 shows skewnesses and kurtosises of profiles of upper surfaces of cathodes 101 formed on respective electron transport layers 102.

FIGS. 21A-21F show SEM photographs of ITO films formed by facing target sputtering.

FIGS. 22A-22F show SEM photographs of ITO films formed by magnetron sputtering.

DESCRIPTION OF EMBODIMENT

Figure 1:
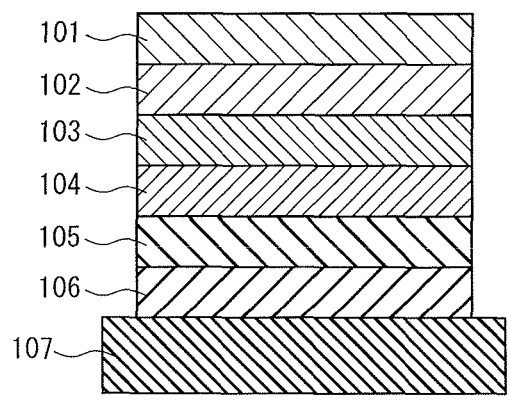
FIG. 1 is a sectional view showing one example of the structure of an organic electroluminescent element 100 according to one embodiment of the present invention.

Findings Underlying One Embodiment of Present Invention

The findings underlying one embodiment of the present invention are described first.

As organic electroluminescent elements become more prevalent, further improvement in device performance, such as an element lifetime and light-emitting efficiency, is required.

An organic electroluminescent element includes one or more organic functional layers between an upper electrode and a lower electrode, and is manufactured by forming, on a substrate, the lower electrode, the one or more organic functional layers, and the upper electrode in the stated order typically by a method such as vapor deposition and sputtering.

In a process of forming the upper electrode on the organic functional layer, oxygen in an ambient gas and a material for the upper electrode intrude into the organic functional layer, which is an underlayer. Intrusion of oxygen and the material for the upper electrode leads to degradation of performance, such as electron injection properties, of the organic functional layer. As a result, device performance, such as an element lifetime and light-emitting efficiency, of the organic electroluminescent element degrades.

The inventors found, as a result of intense study, that oxygen and the material for the upper electrode intrude into the organic functional layer through spaces between molecules of a material constituting the upper electrode as a thin film (hereinafter, an "upper electrode film") at an early stage of forming the upper electrode on the organic functional layer, and profile of the upper electrode film formed at an interface between the organic functional layer and the upper electrode is one of factors affecting device performance of the organic electroluminescent element. The upper electrode films are stacked to eventually form the upper electrode. Therefore, profile of an upper surface of the upper electrode is considered to reflect the profile of the upper electrode film.

The inventors focused on the profile of the upper surface of the upper electrode, and arrived at one embodiment of the present invention described below.

Summary of One Embodiment of Present Invention

An organic electroluminescent element as one embodiment of the present invention is an organic electroluminescent element comprising: a lower electrode; an organic functional layer on the lower electrode; and an upper electrode on the organic functional layer, wherein profile of an upper surface of the upper electrode has a skewness of between −0.5 and 0.7 inclusive.

In a specific aspect of the organic electroluminescent element according to one embodiment of the present invention, profile of the upper surface of the upper electrode has a kurtosis of between −0.7 and 0.3 inclusive.

In a specific aspect of the organic electroluminescent element according to one embodiment of the present invention, the organic functional layer serves as an underlayer for forming the upper electrode.

In a specific aspect of the organic electroluminescent element according to one embodiment of the present invention, the upper electrode has been formed by magnetron sputtering with a power density of between 4.5 W/cm$^2$ and 9.0 W/cm$^2$ inclusive.

In a specific aspect of the organic electroluminescent element according to one embodiment of the present invention, oxygen is distributed in the organic functional layer from an interface with the upper electrode to a depth of 18 nm or less.

In a specific aspect of the organic electroluminescent element according to one embodiment of the present invention, the organic functional layer is composed of a plurality of layers including an electron transport layer, the lower electrode is an anode, and the upper electrode is a cathode, and is in contact with the electron transport layer.

In a specific aspect of the organic electroluminescent element according to one embodiment of the present invention, the upper electrode is made of a light-transmissive electrically-conductive material.

In a specific aspect of the organic electroluminescent element according to one embodiment of the present invention, the upper electrode is made of an oxide containing at least one selected from the group consisting of In, Ti, Zn, and Sn.

A method for manufacturing an organic electroluminescent element as one embodiment of the present invention is a method for manufacturing an organic electroluminescent element comprising: forming a lower electrode on a substrate; forming an organic functional layer on the lower electrode; and forming an upper electrode on the organic functional layer so that profile of an upper surface of the upper electrode has a skewness of between −0.5 and 0.7 inclusive.

Embodiment 1

The following describes an embodiment of the present invention with reference to the drawings.

[Structure of Organic Electroluminescent Element]

The structure of an organic electroluminescent element according to one embodiment of the present invention is described first. FIG. 1 is a sectional view showing one example of the structure of an organic electroluminescent element 100 according to one embodiment of the present invention. As shown in FIG. 1, the organic electroluminescent element 100 includes a cathode 101, an electron transport layer 102, a light-emitting layer 103, a hole transport layer 104, a hole injection layer 105, an anode 106, and a substrate 107. The following describes the above-mentioned components.

<Cathode>

The cathode 101 has a function to inject electrons into the electron transport layer 102. Examples of a material for the cathode 101 are indium tin oxide (ITO), indium zinc oxide (IZO), silver (Ag), aluminum (Al), an alloy of silver, palladium, and copper, and an alloy of silver, rubidium, and gold, an alloy of molybdenum and chromium (MoCr), and an alloy of nickel and chromium (NiCr).

Especially in a top-emission type organic electroluminescent element that emits light from a cathode-side thereof, a light-transmissive electrically-conductive material made of an oxide containing at least one of In, Ti, Zn, and Sn, such as ITO, IZO, ZnO, and $TiO_2$, is used.

The technical feature of the organic electroluminescent element according to one embodiment of the present invention lies in profile of an upper surface of the cathode 101 formed on the electron transport layer 102. As described in detail later, in the organic electroluminescent element according to one embodiment of the present invention, the profile of the upper surface of the cathode 101 specifically has a skewness of between −0.5 and 0.7 inclusive. More preferably, in the organic electroluminescent element according to one embodiment of the present invention, the profile of the upper surface of the cathode 101 has a kurtosis of between −0.7 and 0.3 inclusive.

By forming, on the electron transport layer 102, a film having a high flatness and few spaces therein, intrusion of oxygen and a material for an electrode into the electron transport layer 102 can be suppressed, and an organic electroluminescent element having excellent device performance, such as an element lifetime and light-emitting efficiency, can be provided.

<Electron Transport Layer>

The electron transport layer 102 has a function to transport electrons injected from the cathode 101 to the light-emitting layer 103. Examples of a material for the electron transport layer 102 are a nitro-substituted fluorenone derivative, a thiopyran dioxide derivative, a diphenylquinone derivative, a perylene tetracarboxyl derivative, an anthraquinodimethane derivative, a fluoronylidene methane derivative, an anthrone derivative, an oxadiazole derivative, a perinone derivative, and a quinoline complex derivative (each listed in Japanese Patent Application Publication No. 5-163488), a phosphorus oxide derivative, a triazole derivative, a triazine derivative, a silole derivative, a dimesitylboron derivative, and a triarylboron derivative.

<Light-Emitting Layer>

The light-emitting layer 103 is a portion for emitting light by recombination of carriers (holes and electrons). Examples of a material for the light-emitting layer 103 are an oxinoid compound, perylene compound, and coumarin compound.

<Hole Transport Layer>

The hole transport layer 104 has a function to transport holes injected from the anode 106 to the light-emitting layer 103. Examples of a material for the hole transport layer 106 are an aromatic tertiary amine derivative and a phthalocyanine derivative.

<Hole Injection Layer>

The hole injection layer 105 has a function to promote injection of holes from the anode 106 into the hole transport layer 104. Examples of a material for the hole injection layer 105 are metal oxide, metal nitride, and metal oxynitride. Examples of the metal oxide are molybdenum oxide ($MoO_x$), tungsten oxide ($WO_x$), and molybdenum-tungsten oxide ($Mo_xW_yO_z$).

<Anode>

The anode 106 has a function to inject holes into the hole injection layer 105. Examples of a material for the anode 106 are silver (Ag), aluminum (Al), an alloy of silver, palladium, and copper, and an alloy of silver, rubidium, and gold, an alloy of molybdenum and chromium (MoCr), an alloy of nickel and chromium (NiCr), indium tin oxide (ITO), and indium zinc oxide (IZO).

In a bottom-emission type organic electroluminescent element that emits light from a substrate-side thereof, a light-transmissive electrically-conductive material made of an oxide containing at least one of In, Ti, Zn, and Sn, such as ITO, IZO, ZnO, and $TiO_2$, is used.

In a top-emission type organic electroluminescent element that emits light from a cathode-side thereof, a light-reflective material is used.

In the top-emission type organic electroluminescent element, a reflecting electrode may be provided between the anode 106 and the substrate 107.

<Substrate>

The substrate 107 serves as a base for the organic electroluminescent element. The organic electroluminescent element 100 is manufactured by sequentially stacking, on the substrate 107, the anode 106, the organic functional layers (the hole injection layer 105, the hole transport layer 104, the light-emitting layer 103, and the electron transport layer 102), and the cathode 101. An example of a material for the substrate 107 is an insulating material such as alkali-free glass, soda glass, nonfluorescent glass, phosphate glass, borate glass, quartz, acrylic resin, styrenic resin, polycarbonate resin, epoxy resin, polyethylene, polyester, silicone resin, and alumina.

<Others>

Although not illustrated in FIG. 1, a sealing layer is provided on the cathode 101 for the purpose of preventing the organic functional layers from deteriorating due to being exposed to moisture and air. In the case of the top-emission type organic electroluminescent element, an example of a material for the sealing layer is a light-transmissive material such as silicon nitride (SiN) and silicon oxynitride (SiON).

This concludes the description of the structure of the organic electroluminescent element 100 according to one embodiment of the present invention.

[Method for Manufacturing Organic Electroluminescent Element]

Figure 2:
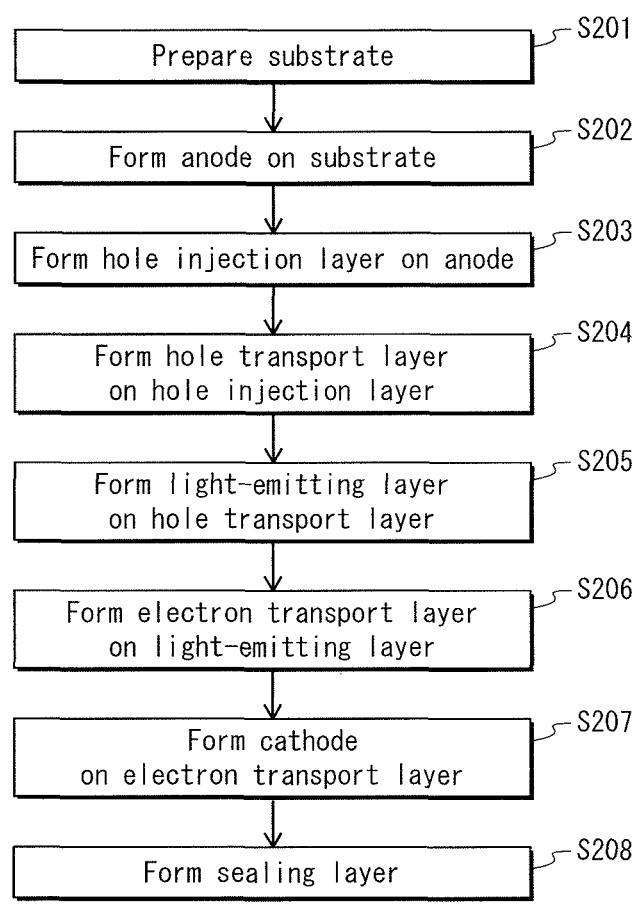
FIG. 2 is a flow chart showing a process of manufacturing an organic electroluminescent element according to one embodiment of the present invention.

A method for manufacturing the organic electroluminescent element according to one embodiment of the present invention is described next. FIG. 2 is a flow chart showing a process of manufacturing the organic electroluminescent element according to one embodiment of the present invention.

As shown in FIG. 2, the substrate 107 serving as a base for the organic electroluminescent element is prepared (step S201), and the anode 106 is formed on the substrate 107 (step S202). The anode 106 is formed by a method such as vapor deposition and sputtering.

Organic functional layers are then formed on the anode 106 (steps S203 through S206).

Specifically, the hole injection layer 105 is first formed on the anode 106 (step S203). After forming the hole injection layer 105, the hole transport layer 104 is formed on the hole injection layer 105 (step S204). After forming the hole transport layer 104, the light-emitting layer 103 is formed on the hole transport layer 104 (step S205). After forming the light-emitting layer 103, the electron transport layer 102 is formed on the light-emitting layer 103 (step S206). These organic functional layers are formed by a method such as vapor deposition and application using an inkjet device.

After forming the organic functional layers, the cathode 101 is formed on the electron transport layer 102 (step S207). As described in detail later, the cathode 101 is specifically formed, for example, by magnetron sputtering so that profile of an upper surface of the cathode 101 has a skewness of between −0.5 and 0.7 inclusive. The cathode 101 is more preferably formed, for example, by magnetron sputtering so that the profile of the upper surface of the cathode 101 has a kurtosis of between −0.7 and 0.3 inclusive.

After forming the cathode 101, the sealing layer is formed on the cathode 101 (step S208).

By thus sequentially stacking, on the substrate, the anode, the organic functional layers, and the cathode, the organic electroluminescent element is manufactured.

This concludes the description of the method for manufacturing the organic electroluminescent element according to one embodiment of the present invention.

[Details of Cathode 101]

The inventors focused on the profile of the upper surface of the cathode 101, and found, as a result of intense study, that intrusion of oxygen and a material for an electrode into the electron transport layer 102 as the underlayer can be suppressed when the profile of the upper surface of the cathode 101 has a skewness of between −0.5 and 0.7 inclusive, and that an organic electroluminescent element having excellent device performance, such as an element lifetime and light-emitting efficiency, can be provided. The inventors also found that, when the profile of the upper surface of the cathode 101 has a kurtosis of between −0.7 and 0.3 inclusive, intrusion of oxygen and the material for the electrode can be suppressed more significantly. The profile of the upper surface of the cathode 101 is described in detail below.

Figure 3:
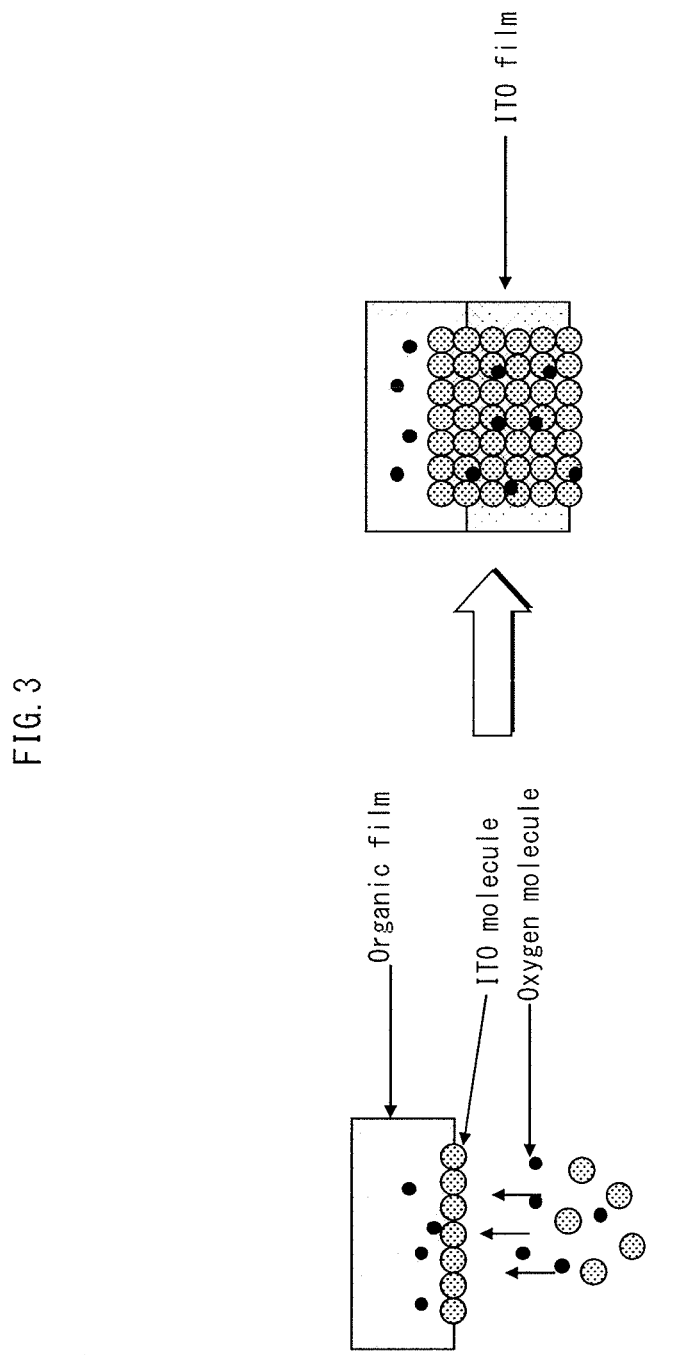
FIG. 3 schematically illustrates a process of forming a cathode 101.

FIG. 3 schematically illustrates a process of forming the cathode 101. In an example shown in FIG. 3, ITO is used as the material for the electrode.

As illustrated in FIG. 3, the cathode 101 is formed on an organic film (the electron transport layer 102) by a method such as sputtering and vapor deposition. In the process of forming the cathode 101, oxygen in an ambient gas and a material for the cathode 101 intrude into the electron transport layer 102 as the underlayer. Intrusion of oxygen and the material for the electrode leads to degradation of performance, such as electron injection properties, of the electron transport layer 102. As a result, device performance, such as an element lifetime and light-emitting efficiency, of the organic electroluminescent element degrades.

Figure 4:
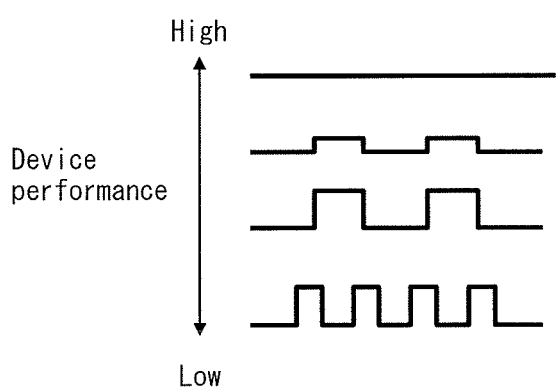
FIG. 4 is a conceptual diagram showing a relation between profile of an upper surface of the cathode 101 and device performance of an organic electroluminescent element.

Molecules of oxygen in the ambient gas and ITO as the material for the cathode 101 intrude into the electron transport layer 102 through spaces in an ITO molecular film formed on the electron transport layer 102. It is considered herein that a higher flatness of the profile of the upper surface of the cathode 101 means fewer spaces. Therefore, when the profile of the upper surface of the cathode 101 has a high flatness, intrusion of molecules of oxygen and ITO into the electron transport layer 102 can be suppressed, and an organic electroluminescent element having excellent device performance, such as an element lifetime and light-emitting efficiency, can be provided. That is to say, a relation between the profile of the upper surface of the cathode 101 and device performance of the organic electroluminescent element is as shown in a conceptual diagram of FIG. 4.

As parameters representing the profile of the upper surface of the cathode 101, the inventors focused on skewness and kurtosis.

Skewness and kurtosis indicate the extent to which a distribution is biased relative to a normal distribution. The normal distribution is expressed by the following equation, where μ denotes the mean, and σ² denotes variance.

$$f(x) = \frac{1}{\sqrt{2\pi}\,\sigma} \exp\left(-\frac{(x-\mu)^2}{2\sigma^2}\right) \qquad \text{[Math 1]}$$

Skewness is herein defined by the following equation, where μ denotes the mean, s denotes the standard deviation, and n denotes the number of samples.

[Math 2]

$$\text{Skew} = \frac{n}{(n-1)(n-2)} \sum_{i=1}^{n} \left(\frac{X_i - \mu}{S}\right)^3 \qquad (1)$$

Skewness defined by the above-mentioned equation (1) indicates the extent to which a distribution is biased to the left or to the right relative to the normal distribution. In the present embodiment, skewness indicates a ratio between protrusions and recesses in the profile of the upper surface of the cathode 101.

Kurtosis is defined by the following equation, where μ denotes the mean, s denotes the standard deviation, and n denotes the number of samples.

[Math 3]

$$\text{Kurt} = \left\{ \frac{n(n+1)}{(n-1)(n-2)(n-3)} \sum_{i=1}^{n} \left(\frac{X_i - \mu}{S}\right)^4 \right\} - \frac{3(n-1)^2}{(n-2)(n-3)} \qquad (2)$$

Kurtosis defined by the above-mentioned equation (2) indicates the extent to which a distribution is biased to the top or to the bottom relative to the normal distribution. In the present embodiment, kurtosis indicates a degree of sharpness of protrusions in the profile of the upper surface of the cathode 101.

Figure 5A:
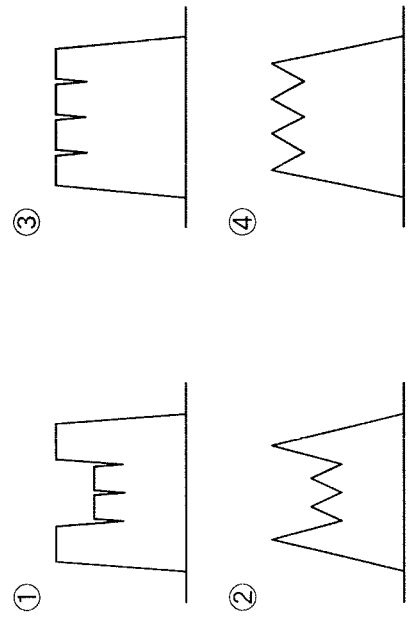
FIGS. 5A and 5B are schematic diagrams showing a relation between skewness/kurtosis and the profile of the upper surface of the cathode 101.
Figure 5B:
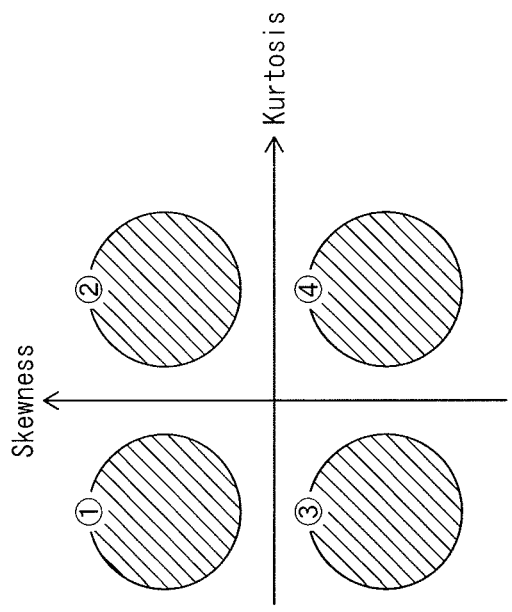

FIGS. 5A and 5B are schematic diagrams showing a relation between skewness/kurtosis and the profile of the upper surface of the cathode 101. As shown in FIGS. 5A and 5B, a higher value of skewness means rougher upper surface of the cathode 101. Further, a higher value of kurtosis means a higher degree of sharpness of protrusions in the upper surface of the cathode 101.

The inventors formed the cathodes 101 by magnetron sputtering and facing target sputtering under different conditions, and examined skewness and kurtosis of profiles of the upper surfaces of the cathodes 101.

Details of conditions during film formation by magnetron sputtering and facing target sputtering are shown below.

TABLE 1

| method | condition | distance between target and film-forming substrate [mm] | power [kW] | ambient gas pressure [Pa] | gas flow [sccm] Ar | gas flow [sccm] O₂ | frequency [kHz] | duty ratio [%] |
|---|---|---|---|---|---|---|---|---|
| magnetron sputtering | standard | 80 | 5.4 | 0.6 | 200 | 10 | 250 | 72.5 |
| | low duty | | | 0.6 | 200 | 10 | 250 | 60 |
| | low frequency | | | 0.6 | 200 | 10 | 100 | 73 |

TABLE 1-continued

| method | condition | distance between target and film-forming substrate [mm] | power [kW] | ambient gas pressure [Pa] | gas flow [sccm] Ar | gas flow [sccm] $O_2$ | frequency [kHz] | duty ratio [%] |
|---|---|---|---|---|---|---|---|---|
| | low pressure | | | 0.5 | 100 | 6 | 250 | 72.5 |
| | oxygen flow UP | | | 0.6 | 200 | 15 | 250 | 72.5 |
| facing target sputtering | standard | 120 | 2.5 | 0.6 | 200 | 1.5 | 250 | 72.5 |
| | low duty | | | 0.6 | 200 | 1.5 | 250 | 60 |
| | high frequency | | | 0.6 | 200 | 1.5 | 350 | 72 |
| | low pressure | | | 0.2 | 100 | 2.3 | 250 | 72.5 |
| | oxygen flow UP | | | 0.6 | 200 | 3 | 250 | 72.5 |

In Table 1 shown above, the power is 5.4 kW in magnetron sputtering, and 2.5 kW in facing target sputtering. The power density, which refers to a power per unit target area, in magnetron sputtering is 9.0 W/cm$^2$.

The gas flow refers to a flow of gas supplied to a sputtering chamber. The frequency refers to a pulse frequency of current applied to the target. The duty ratio refers to a positive bias time per pulse cycle.

In the present embodiment, skewness and kurtosis were derived by conducting image analysis of SEM photographs obtained through observation of the upper surfaces of the cathodes 101 at 150,000-fold magnification. The image analysis was conducted by using two-dimensional image analysis software "WinRoof" made by Mitani Corporation. The experimental results are as follows.

TABLE 2

| process | | kurtosis | | | skewness | | |
|---|---|---|---|---|---|---|---|
| method | condition | AVE | MAX | MIN | AVE | MAX | MIN |
| magnetron sputtering | low duty | −0.3 | −0.1 | −0.6 | 0.1 | 0.7 | −0.5 |
| | low pressure | −0.2 | 0.1 | −0.5 | 0.2 | 0.5 | 0.0 |
| | oxygen flow UP | −0.1 | 0.3 | −0.7 | 0.3 | 0.7 | 0.1 |
| | low frequency | −0.2 | 0.0 | −0.3 | 0.2 | 0.5 | 0.0 |
| | standard | −0.1 | 0.1 | −0.2 | 0.3 | 0.5 | 0.2 |
| facing target sputtering | low duty | 5.6 | 16.7 | 1.8 | 1.8 | 3.3 | 1.3 |
| | low pressure | 1.5 | 4.8 | 0.4 | 0.6 | 1.8 | −0.1 |
| | oxygen flow UP | 0.9 | 3.4 | 0.1 | 0.7 | 1.7 | 0.2 |
| | high frequency | 1.1 | 2.4 | 0.2 | 0.9 | 1.5 | 0.3 |
| | standard | 1.7 | 4.7 | −0.1 | 0.7 | 1.8 | −0.2 |

FIG. 6 shows the experimental data in above-mentioned Table 2 as plotted in a graph showing skewness on its vertical axis and kurtosis on its horizontal axis.

Table 2 and FIG. 6 show that the cathode 101 formed by magnetron sputtering in a high energy process has a high flatness. Specifically, maximum and minimum values of skewness of the cathode 101 formed by magnetron sputtering are 0.7 and −0.5, respectively. Further, maximum and minimum values of kurtosis of the cathode 101 formed by magnetron sputtering are 0.3 and −0.7, respectively.

As described in detail later, an organic electroluminescent element having high electron injection properties from a cathode into an electron transport layer can be manufactured by forming the cathode on the electron transport layer by magnetron sputtering in a high energy process. In order to obtain an organic electroluminescent element having excellent device performance, it is preferred that the profile of the upper surface of the cathode 101 formed on the electron transport layer 102 have a skewness of between −0.5 and 0.7 inclusive. When the profile of the upper surface of the cathode 101 formed on the electron transport layer 102 has a skewness of between −0.5 and 0.7 inclusive, intrusion of oxygen and the material for the electrode into the electron transport layer 102 can be suppressed, and thus an organic electroluminescent element having excellent device performance, such as an element lifetime and light-emitting efficiency, can be obtained.

The profile of the upper surface of the cathode 101 formed on the electron transport layer 102 more preferably has a kurtosis of between −0.7 and 0.3 inclusive. In this case, since a degree of sharpness of protrusions is low, intrusion of oxygen and the material for the electrode into the electron transport layer 102 can further be suppressed, and thus an organic electroluminescent element having excellent device performance, such as an element lifetime and light-emitting efficiency, can be obtained.

Figure 7:
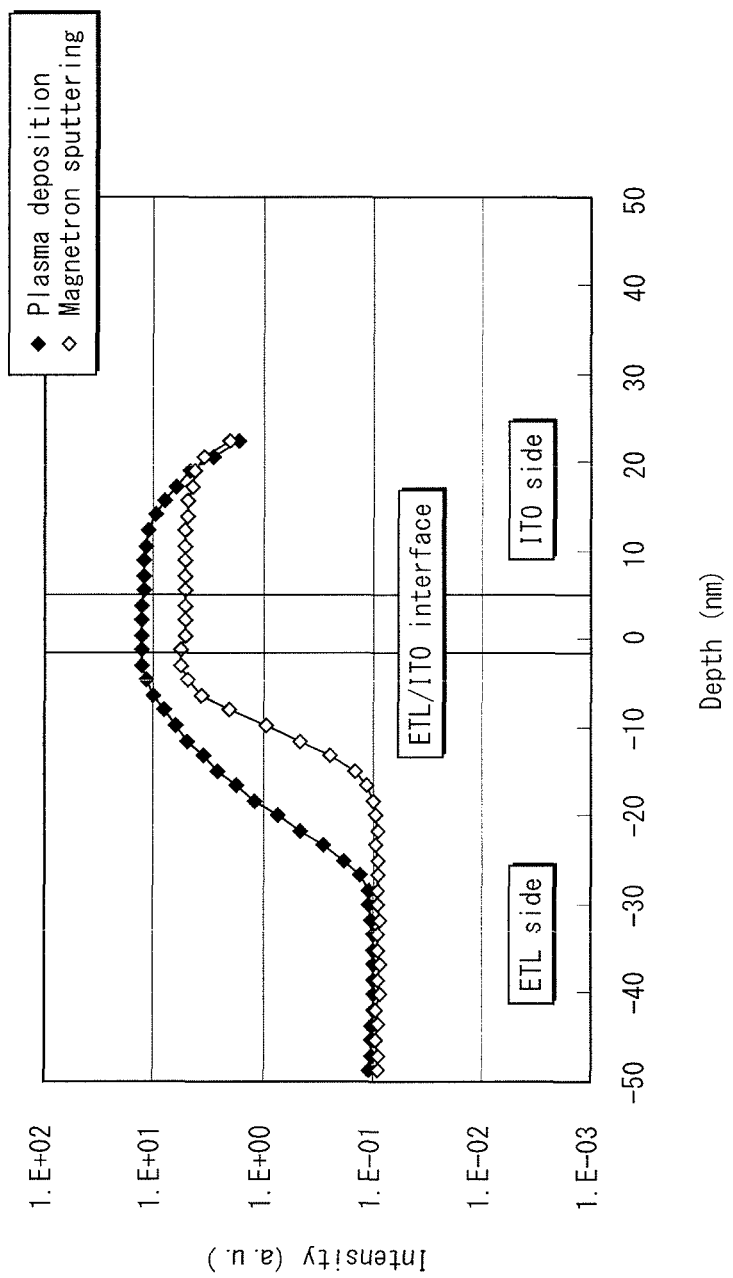
FIG. 7 shows results of analysis of intensity of oxygen distribution in an electron transport layer (ETL) by secondary ion mass spectrometry (SIMS).

FIG. 7 shows results of analysis of intensity of oxygen distribution in an electron transport layer (ETL) by secondary ion mass spectrometry (SIMS). The horizontal axis is the depth (nm), and the vertical axis is the intensity as detected (a.u.). In the experimental results shown in FIG. 7, ITO films are formed on electron transport layers by magnetron sputtering and plasma deposition. Conditions during film formation by magnetron sputtering are the same as the standard condition shown in Table 1. Conditions during film formation by plasma deposition indicate: a distance between a target and a film-forming substrate of 50 cm; a power of 30 kW; an ambient gas pressure of 0.7 Pa; an Ar gas flow of 300 sccm; an $O_2$ gas flow of 35 sccm; and an $H_2O$ gas flow of 5 sccm.

Figure 8:
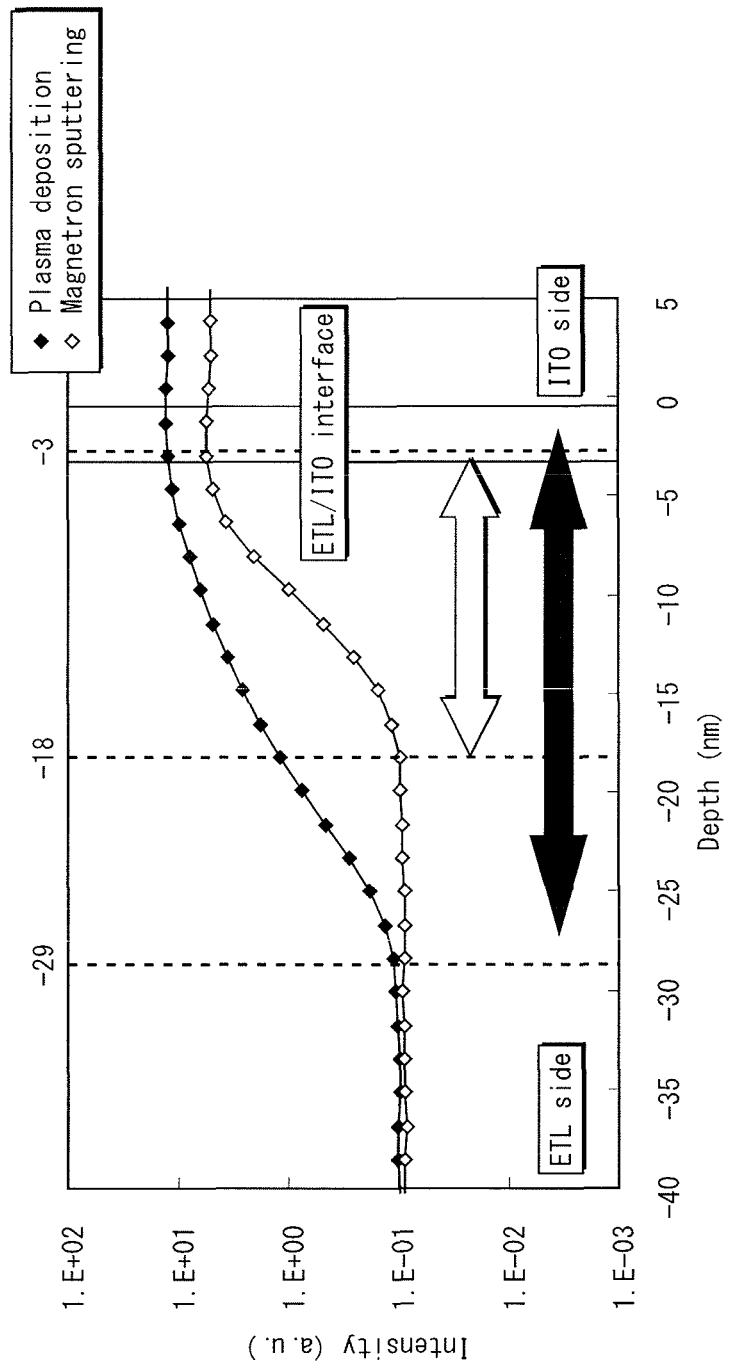
FIG. 8 is an enlarged view of a part of the experimental results shown in FIG. 7 in a depth range of 5 nm to −40 nm.

FIG. 8 is an enlarged view of a part of the experimental results shown in FIG. 7 in a depth range of 5 nm to −40 nm. FIG. 8 shows that, when the ITO film is formed on the electron transport layer by plasma deposition, oxygen diffuses in the electron transport layer to a depth of approximately 26 nm to 29 nm. FIG. 8 also shows that, when the ITO film is formed on the electron transport layer by magnetron sputtering, oxygen diffuses in the electron transport layer to a depth of approximately 15 nm to 18 nm. The results show that, when the ITO film is formed on the electron transport layer by magnetron sputtering in a high energy process, the ITO film thus formed on the electron transport layer has a high flatness, and oxygen diffusion in the electron transport layer can be suppressed.

Figure 9:
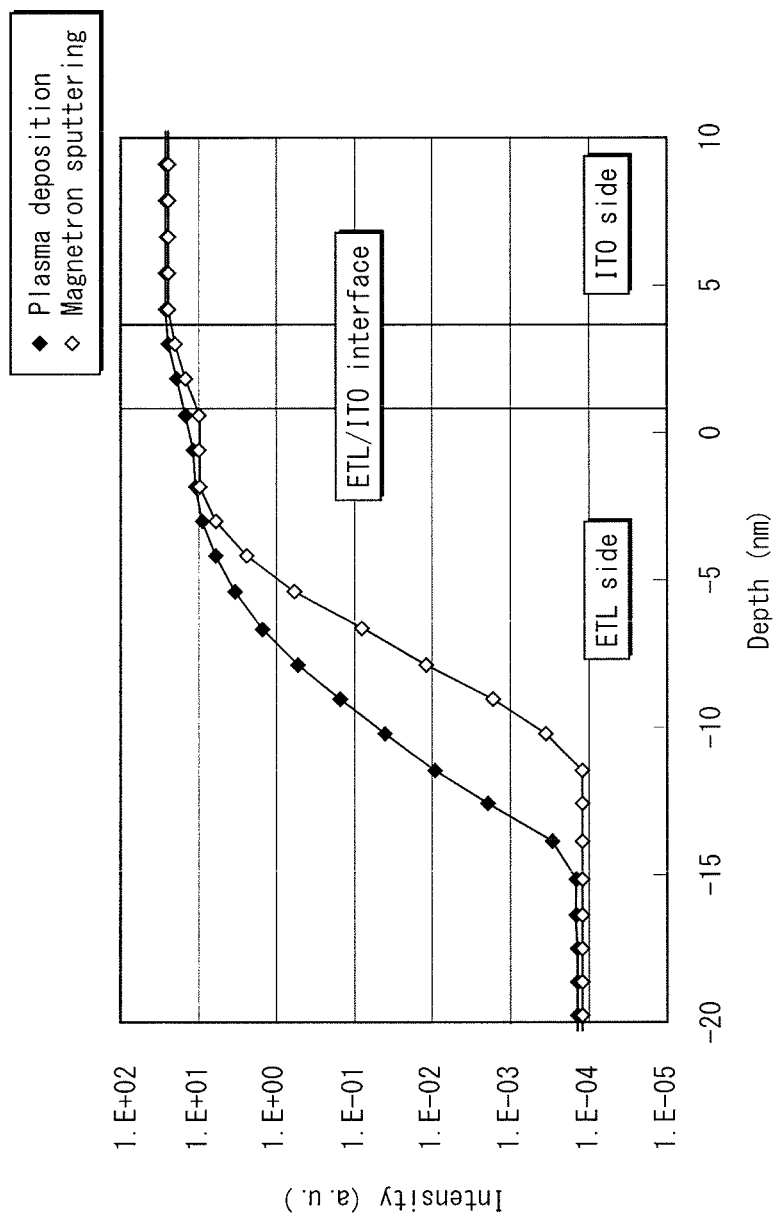
FIG. 9 shows results of analysis of intensity of indium (In) distribution in an electron transport layer (ETL) by secondary ion mass spectrometry (SIMS).

FIG. 9 shows results of analysis of intensity of indium (In) distribution in the electron transport layer (ETL) by secondary ion mass spectrometry (SIMS). The horizontal axis is the depth (nm), and the vertical axis is the intensity as detected (a.u.). In the experimental results shown in FIG. 9, ITO films are formed on electron transport layers by magnetron sputtering and plasma deposition. Conditions during film formation by magnetron sputtering and plasma deposition are the same as those in the experiment shown in FIG. 7.

FIG. 9 shows that, when the ITO film is formed on the electron transport layer by plasma deposition, indium diffuses in the electron transport layer to a depth of approximately 16 nm to 19 nm. FIG. 9 also shows that, when the ITO film is formed on the electron transport layer by magnetron sputtering, indium diffuses in the electron transport layer to a depth of approximately 12 nm to 15 nm. Indium is a substance included in ITO. It is found that diffusion of the material for the electrode in the electron transport layer can be suppressed by forming an ITO film having a high flatness on the electron transport layer.

Figure 10:
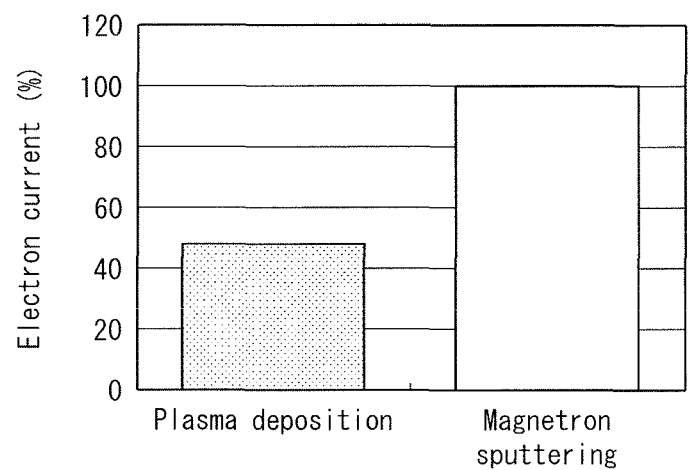
FIG. 10 shows values of current flowing through electron only devices (EODs) manufactured by forming cathodes by magnetron sputtering and plasma deposition.

FIG. 10 shows values of current flowing when a voltage of 5V is applied to electron only devices (EODs) manufactured by forming cathodes by magnetron sputtering and plasma deposition. Conditions during film formation by magnetron sputtering and plasma deposition are the same as those in the experiment shown in FIG. 7. The electron current shown on the vertical axis is a value of the electron current relative to a value of the electron current of a bipolar device (BPD) manufactured by forming a cathode by magnetron sputtering.

FIG. 10 shows that the EOD manufactured by forming the cathode by magnetron sputtering has higher electron injection properties than the EOD manufactured by forming the cathode by plasma deposition. Presumably, this is because intrusion of oxygen and the material for the electrode into the electron transport layer can be suppressed by forming a cathode having a high flatness on the electron transport layer. In contrast, since the cathode having a high flatness cannot be formed on the electron transport layer by plasma deposition, intrusion of oxygen and the material for the electrode into the electron transport layer cannot be suppressed, and thus the EOD manufactured by forming the cathode by plasma deposition has lower electron injection properties.

Figure 11:
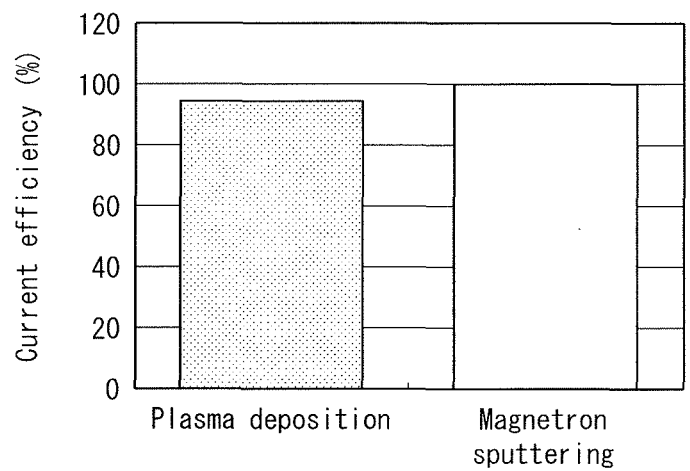
FIG. 11 shows current efficiencies of bipolar devices (BPDs) manufactured by forming cathodes by magnetron sputtering and plasma deposition.

FIG. 11 shows current efficiencies of bipolar devices (BPDs) manufactured by forming cathodes by magnetron sputtering and plasma deposition. The current efficiency shown on the vertical axis is a value of the current efficiency relative to a value of the current efficiency of a bipolar device (BPD) manufactured by forming a cathode by magnetron sputtering. Conditions during film formation by magnetron sputtering and plasma deposition are the same as those in the experiment shown in FIG. 7.

FIG. 11 shows that the BPD manufactured by forming the cathode by magnetron sputtering has a higher current efficiency than the BPD manufactured by forming the cathode by plasma deposition. Presumably, this is because intrusion of oxygen and the material for the electrode into the electron transport layer can be suppressed by forming a cathode having a high flatness on the electron transport layer.

Figure 12:
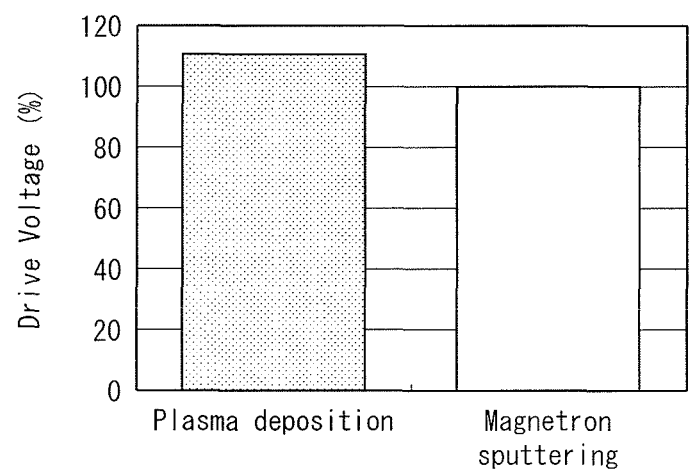
FIG. 12 shows values of drive voltage of the bipolar devices (BPDs) manufactured by forming the cathodes by magnetron sputtering and plasma deposition.

FIG. 12 shows values of voltage required to drive, with a current density of 10 mA/cm², the bipolar devices (BPDs) manufactured by forming the cathodes by magnetron sputtering and plasma deposition. The voltage shown on the vertical axis is a value of voltage relative to a value of voltage of a bipolar device (BPD) manufactured by forming a cathode by magnetron sputtering. Conditions during film formation by magnetron sputtering and plasma deposition are the same as those in the experiment shown in FIG. 7.

FIG. 12 shows that the BPD manufactured by forming the cathode by magnetron sputtering requires a lower voltage for driving the devices with a current density of 10 mA/cm² than the BPD manufactured by forming the cathode by plasma deposition, and has a higher driving efficiency than the BPD manufactured by forming the cathode by plasma deposition. Presumably, this is because intrusion of oxygen and the material for the electrode into the electron transport layer can be suppressed by forming a cathode having a high flatness on the electron transport layer.

Figure 13:
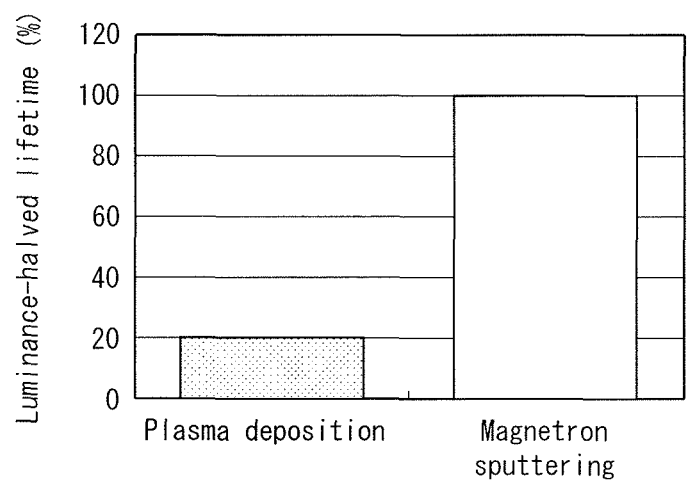
FIG. 13 shows luminance-halved lifetimes of the bipolar devices (BPDs) manufactured by forming the cathodes by magnetron sputtering and plasma deposition.

FIG. 13 shows luminance-halved lifetimes of the bipolar devices (BPDs) manufactured by forming the cathodes by magnetron sputtering and plasma deposition. The luminance-halved lifetime shown on the vertical axis in FIG. 13 is a luminance-halved lifetime relative to a luminance-halved lifetime of a bipolar device (BPD) manufactured by forming a cathode by magnetron sputtering. The luminance-halved lifetime refers to a time until initial luminance of the bipolar device (BPD) is halved when a predetermined voltage is continuously applied to the bipolar device for light emission. Conditions during film formation by magnetron sputtering and plasma deposition are the same as those in the experiment shown in FIG. 7.

FIG. 13 shows that the BPD manufactured by forming the cathode by magnetron sputtering has a longer luminance-halved lifetime than the BPD manufactured by forming the cathode by plasma deposition. Presumably, this is because intrusion of oxygen and the material for the electrode into the electron transport layer can be suppressed by forming a cathode having a high flatness on the electron transport layer.

The thickness of the cathode included in the organic electroluminescent element according to the present embodiment is, for example, 30 nm to 200 nm inclusive.

The sheet resistance of the cathode included in the organic electroluminescent element according to the present embodiment is, for example, 1000 [Ω/□].

The light transmittance of the cathode included in the organic electroluminescent element according to the present embodiment is, for example, 80% to 95% inclusive.

As set forth above, when the profile of the upper surface of the cathode has a high flatness, specifically when the profile of the upper surface of the cathode has a skewness of between −0.5 and 0.7 inclusive, an upper electrode film having few spaces therein is formed on the electron transport layer, and thus intrusion of oxygen and the material for the electrode into the electron transport layer can be suppressed, and an organic electroluminescent element having excellent device performance, such as an element lifetime and light-emitting efficiency, can be provided.

[Magnetron Sputtering in High Energy Process]

The inventors found, as a result of intense study, that an organic electroluminescent element having excellent device performance, such as electron injection properties, can be manufactured by forming the cathode on the electron transport layer by magnetron sputtering in a high energy process. The inventors observed the profile of the upper surface of the cathode included in the organic electroluminescent element, and found that, by forming, on the electron transport layer, a film having a high flatness and thus having few spaces therein, intrusion of oxygen and the material for the electrode into the electron transport layer can be suppressed, and thus an organic electroluminescent element having excellent device performance, such as an element lifetime and light-emitting efficiency, can be provided.

Figure 14:
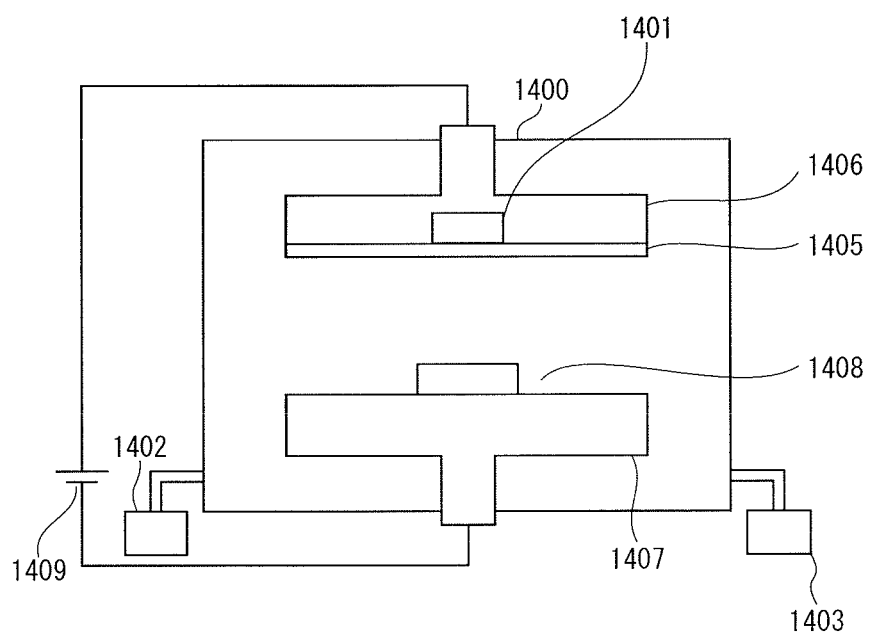
FIG. 14 shows one example of the structure of a magnetron sputtering device 1400.

The structure of a magnetron sputtering device is described first. FIG. 14 shows one example of the structure of a magnetron sputtering device 1400. As illustrated in FIG. 14, the magnetron sputtering device 1400 includes: a sputtering chamber 1401; a gas supply system 1402; an exhaust system 1403; a backing plate 1404; a target 1405; a magnet 1406; a mount 1407; a film-forming substrate 1408 subject to film formation and including the substrate 107 and the organic functional layers formed on the substrate 107; and a power supply 1409.

The magnetron sputtering device 1400 includes the sputtering chamber 1401, and performs sputtering in the sputtering chamber 1401.

To the sputtering chamber 1401, the gas supply system 1402 for introducing a sputtering gas into the sputtering chamber 1401, and the exhaust system 1403 for depressurizing the sputtering chamber 1401 so that the pressure in the sputtering chamber 1401 becomes a predetermined pressure are connected. An inert gas such as argon (Ar) is used as the sputtering gas.

The film-forming substrate 1408 targeted for film formation is provided on the mount 1407 housed in the sputtering chamber 1401. The target 1405, which is made of a material used for film formation and has a plate-like shape, is provided on the backing plate 1404 housed in the sputtering chamber 1401. The magnet 1406 is provided on the rear of the target 1405.

The power supply 1409 applies voltage to the target 1405. Although the power supply 1409 is a DC power supply in the example illustrated in FIG. 14, the power supply 1409 may be an AC power supply or an AC/DC hybrid power supply.

When the exhaust system 1403 evacuates the sputtering chamber 1401, the gas supply system 1402 introduces a sputtering gas into the sputtering chamber 1401, and the power supply 1409 applies voltage to the target 1405, plasma of the sputtering gas is generated, and a surface of the target 1405 is sputtered.

By providing the magnet 1406 on the rear of the target 1405, a magnetic field parallel to the surface of the target 1405 is generated. Ions of the sputtering gas collide with the surface of the target, and dislodge secondary electrons from the target. The secondary electrons are captured by using Lorentz force generated by the magnetic field on the surface of the target 1405, and caused to make a cycloidal or trochoidal motion, so that high-density plasma can be generated in the vicinity of the target.

With the above-mentioned structure of the device, in magnetron sputtering, a thin film can be formed by using high-energy sputtered particles.

This concludes the description of the structure of the magnetron sputtering device. Magnetron sputtering in a high energy process is described next.

In a conventional process of forming a cathode, a method such as vapor deposition and sputtering in a low energy process is used to prevent degradation of properties, such as a drive voltage and an element lifetime, of the organic electroluminescent element caused by the damage to the organic functional layer as the underlayer.

Especially in a top-emission type organic electroluminescent element, in which it is necessary to use a light-transmissive electrically-conductive material made of an oxide containing at least one of In, Ti, Zn, and Sn, such as ITO, IZO, ZnO, $TiO_2$, for a cathode, sputtering in a high energy process is avoided in order to prevent degradation of properties, such as a drive voltage and an element lifetime, of the organic electroluminescent element caused by the damage to the organic functional layer as the underlayer.

In film formation by using the method such as vapor deposition and sputtering in a low energy process, however, energy of atoms or molecules of a target adhering to an organic functional layer is low, and thus adhesion between the upper electrode and the organic functional layer as an underlayer is low. A barrier against injection of electrons or holes between the organic functional layer and the electrode is thus large, and an organic electroluminescent element as manufactured cannot have sufficient properties in terms of a drive voltage and an element lifetime.

To address the above-mentioned problem, the inventors made an assessment of damage to an electron transport layer caused by formation of an ITO film, and examined the possibility of canceling out, by increasing adhesion between the ITO electrode and the electron transport layer, the damage to the electron transport layer caused by forming the ITO film by sputtering in a high energy process.

As a result of the examination, the inventors found that adhesion between the cathode and the organic functional layer can be increased by forming the ITO film by magnetron sputtering in a high energy process in which the amount of ion incident on a film-forming substrate is large, and that it is possible to manufacture a high-efficient, long-lived organic electroluminescent element having high electron injection properties from the cathode into the organic functional layer.

Formation of the cathode by magnetron sputtering in a high energy process is described below in more detail, with reference to results of experiments that the inventors conducted.

First, the inventors formed ITO films on respective electron transport layers by plasma deposition, magnetron sputtering, and facing target sputtering, and evaluated the ITO films as formed. Specifically, the inventors evaluated the ITO films in terms of a grain diameter, a work function, and a sheet resistance.

The power is 5.4 kW in magnetron sputtering, and 2.5 kW in facing target sputtering. The power density, which refers to a power per unit target area, in magnetron sputtering is 9.0 $W/cm^2$.

The ambient gas pressure is 0.6 Pa in magnetron sputtering and in facing target sputtering, and 0.7 Pa in plasma deposition.

Figure 15A:
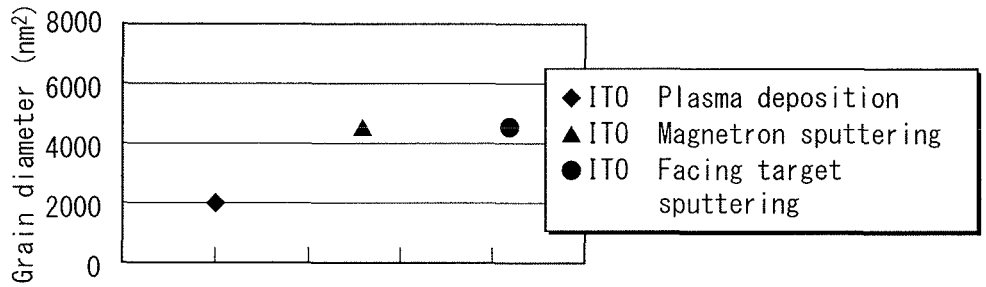
FIGS. 15A-15C show evaluation results of ITO films formed by different methods.
Figure 15B:
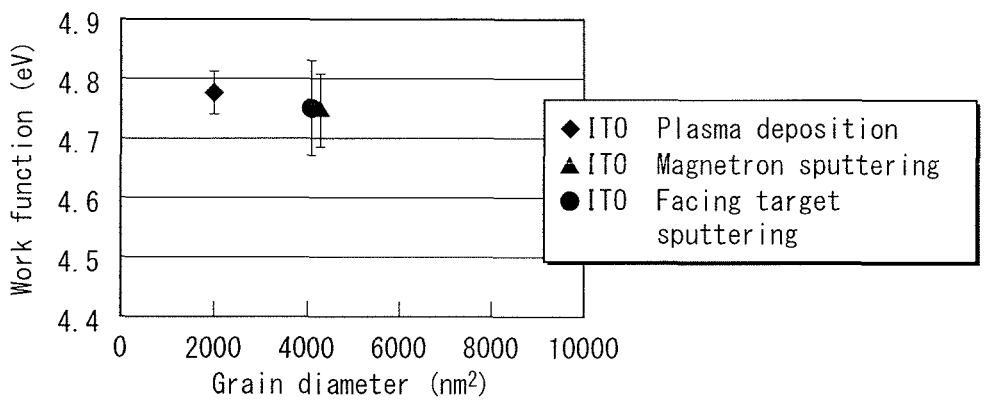
Figure 15C:
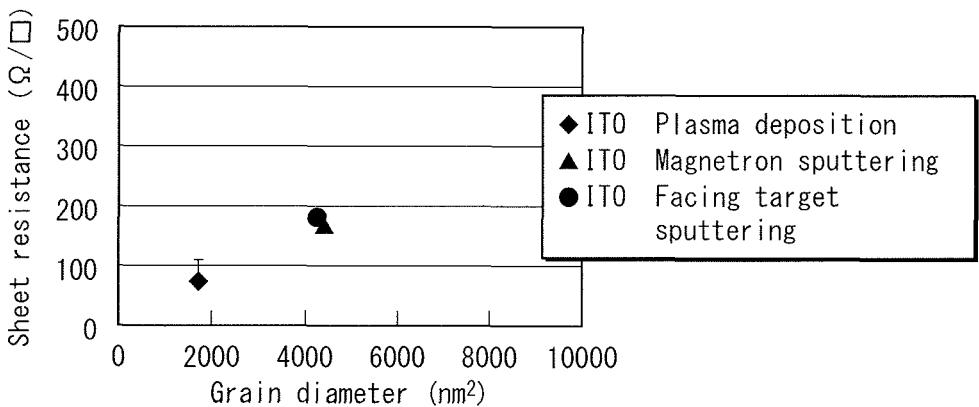

FIGS. 15A-15C show evaluation results of ITO films formed by the different methods. FIGS. 15A, 15B, and 15C respectively show grain diameters obtained by observation under a scanning electron microscope (SEM), work functions, and sheet resistances of the ITO films.

Referring to FIG. 15A, a grain diameter of the ITO film formed by magnetron sputtering is equivalent to that of the ITO film formed by facing target sputtering. A grain diameter of the ITO film formed by plasma deposition is smaller than the grain diameter of the ITO film formed by magnetron sputtering and the grain diameter of the ITO film formed by facing target sputtering.

Referring to FIG. 15B, a work function of the ITO film formed by plasma deposition, a work function of the ITO film formed by magnetron sputtering, and a work function of the ITO film formed by facing target sputtering are equivalent.

Referring to FIG. 15C, the sheet resistance increases in proportion to the grain diameter.

As a result of thus evaluating the ITO films in terms of the grain diameter, the work function, and the sheet resistance, there is no clear difference in work function among the ITO films formed by the different methods.

Figure 16A:
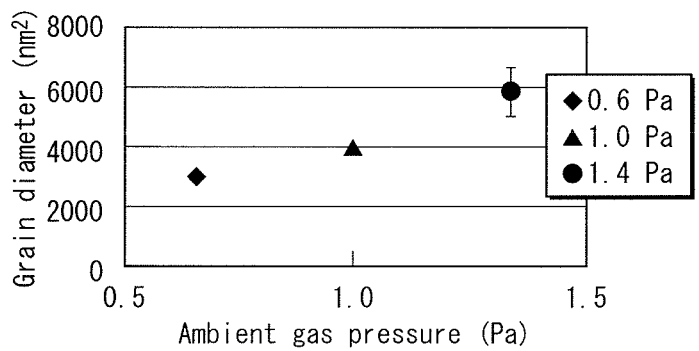
FIGS. 16A-16C show evaluation results of ITO films formed under different ambient gas pressure conditions.
Figure 16B:
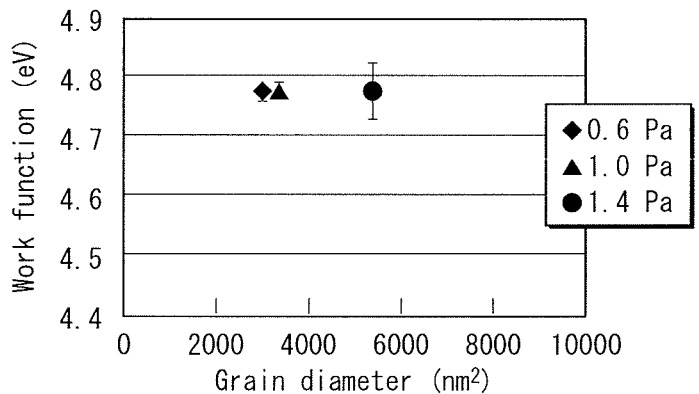
Figure 16C:
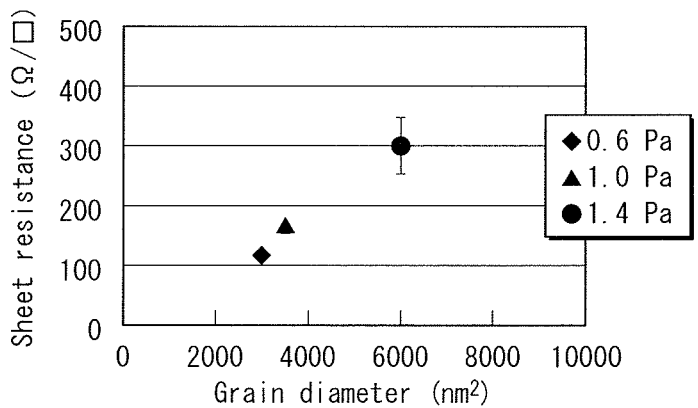

The inventors also formed ITO films on respective electron transport layers by magnetron sputtering under different ambient gas pressure conditions, and evaluated the ITO films thus formed. FIGS. 16A-16C show evaluation results of the ITO films formed under different ambient gas pressure conditions. FIGS. 16A, 16B, and 16C respectively show grain diameters obtained by observation under the SEM, work functions, and sheet resistances of the ITO films. The ITO films evaluated herein were those formed under ambient gas pressure conditions of 0.6 Pa, 1.0 Pa, and 1.4 Pa.

Referring to FIG. 16A, the grain diameter of each ITO film increases in proportion to the ambient gas pressure.

Referring to FIG. 16B, work functions of the ITO films formed under the ambient gas pressure conditions of 0.6 Pa, 1.0 Pa, and 1.4 Pa are equivalent.

Referring to FIG. 16C, the sheet resistance increases in proportion to the grain diameter.

As a result of thus evaluating the ITO films formed by magnetron sputtering under different ambient gas pressure conditions in terms of the grain diameter, the work function, and the sheet resistance, there is no clear difference in work function among the ITO films formed under different ambient gas pressure conditions.

Light transmittances of the ITO films formed by the methods and under the conditions shown in FIGS. 15A-15C and 16A-16C were measured.

Figure 17A:
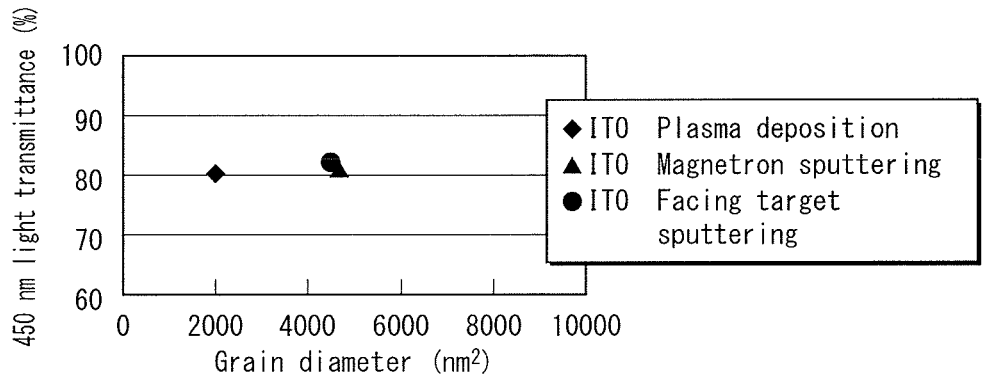
FIGS. 17A-17C show measurement results of light transmittances of ITO films formed by different methods.
Figure 17B:
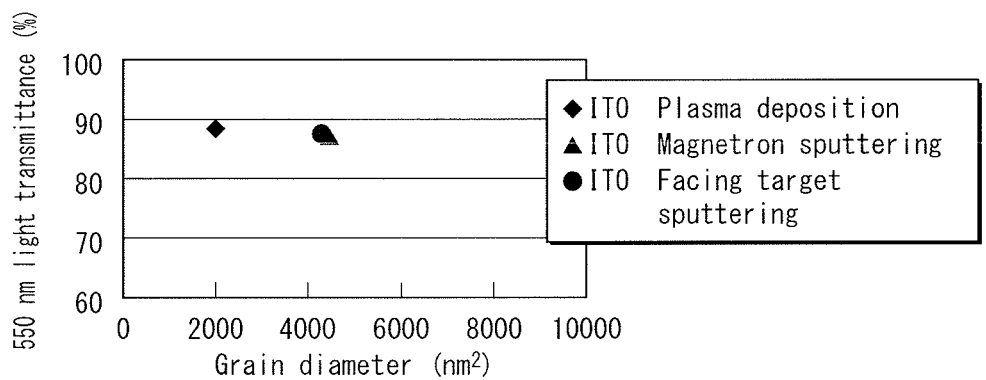
Figure 17C:
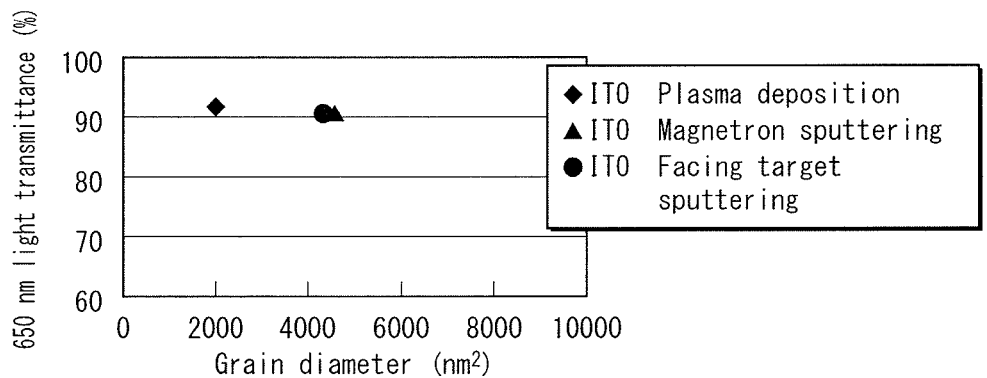

FIGS. 17A-17C show measurement results of light transmittances of ITO films formed by different methods. FIGS. 17A, 17B, and 17C show transmittances with respect to light having a wavelength of 450 nm, light having a wavelength of 550 nm, and light having a wavelength of 650 nm, respectively. Conditions during film formation by plasma deposition, magnetron sputtering, and facing target sputtering are the same as those shown in FIGS. 15A-15C.

Referring to FIGS. 17A-17C, light transmittances of the ITO films formed by the above-mentioned methods are equivalent for each wavelength.

Figure 18A:
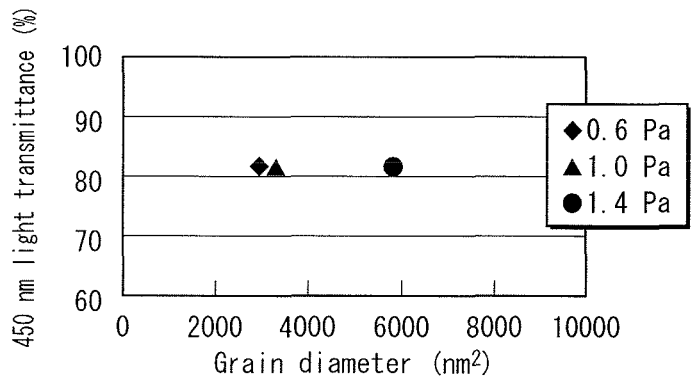
FIGS. 18A-18C show measurement results of light transmittances of ITO films formed under different ambient gas pressure conditions.
Figure 18B:
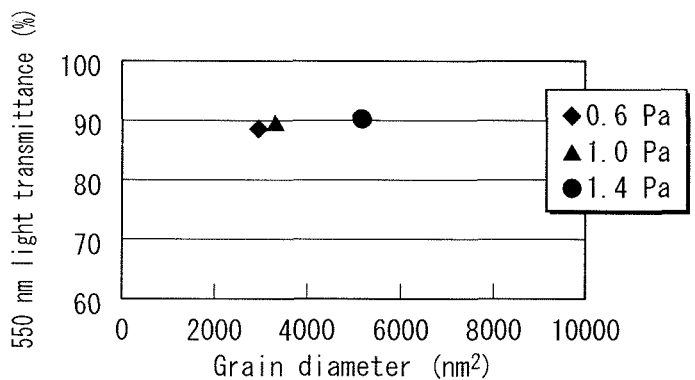
Figure 18C:
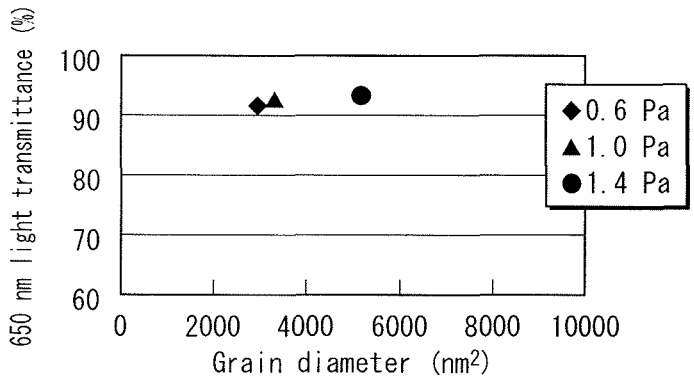

FIGS. 18A-18C show measurement results of light transmittances of ITO films formed under different ambient gas pressure conditions. FIGS. 18A, 18B, and 18C show transmittances with respect to light having a wavelength of 450 nm, light having a wavelength of 550 nm, and light having a wavelength of 650 nm, respectively. As with the conditions shown in FIGS. 16A-16C, light transmittances of the ITO films formed by magnetron sputtering under the ambient gas pressure conditions of 0.6 Pa, 1.0 Pa, and 1.4 Pa were measured.

Referring to FIGS. 18A-18C, light transmittances of the ITO films formed under different ambient gas pressure conditions are equivalent for each wavelength.

Further, an assessment of damage to an organic functional layer as the underlayer caused by forming an ITO film was made by using X-ray photoelectron spectroscopy (XPS). Specifically, in order to make the assessment due to the organic functional layer, 5 nm thick Alq3 (tris(8-quinolinato) aluminum) films were formed on respective glass substrates by vapor deposition, and 35 nm thick indium tin oxide (ITO) films were then formed on the respective Alq3 films by plasma gun deposition, magnetron sputtering, and facing target sputtering, respectively. The Alq3 films were then separated from the glass substrates, and XPS analysis was conducted on interfaces between the Alq3 films and the ITO films. Another sample was prepared by forming a 120 nm thick aluminum (Al) film on the Alq3 film by vapor deposition, and XPS analysis was conducted on an interface between the Alq3 film and the Al film. For comparison, XPS analysis was conducted also on the Alq3 film on which an ITO film is not formed. Alq3 is commonly used as a material for an electron transport layer included in an organic electroluminescent element.

Figure 19B:
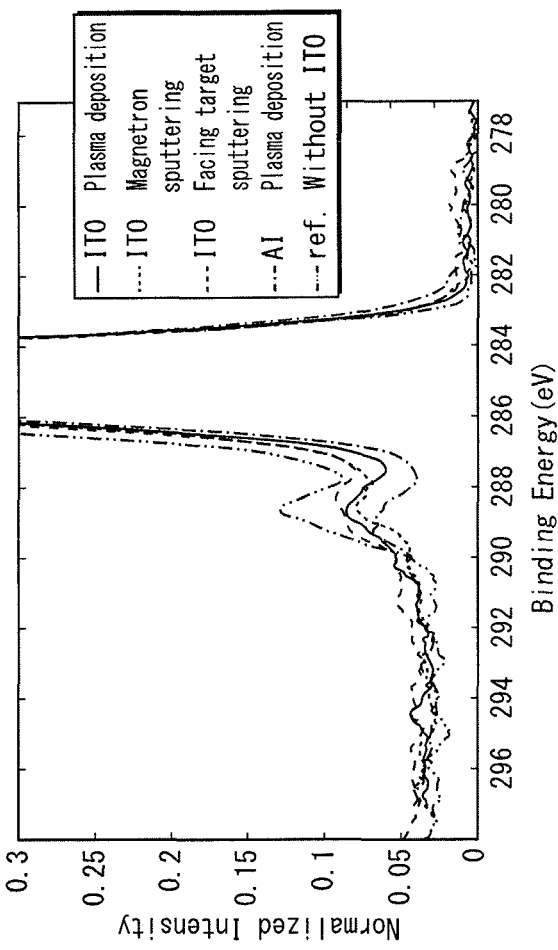
FIGS. 19A and 19B show results of XPS analysis of interfaces between Alq3 films and ITO films.
Figure 19A:
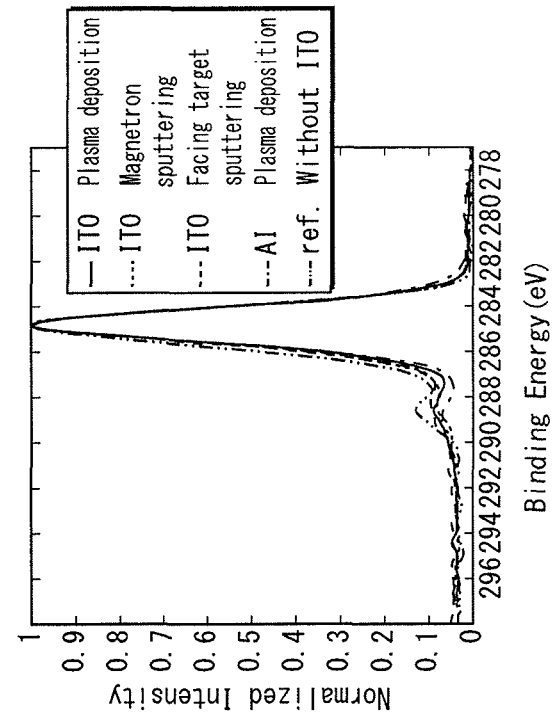

FIGS. 19A and 19B show results of XPS analysis of the interfaces between the Alq3 films and the ITO films. FIG. 19A shows results of comparison of C1s spectra. FIG. 19B is an enlarged view of the results of comparison of C1s spectra shown in FIG. 19A.

Referring to FIGS. 19A and 19B, equivalent decreases in spectrum peak were observed in the ITO films formed by plasma deposition, magnetron sputtering, facing target sputtering in the vicinity of a binding energy of 288 ev to 290 ev. Such decreases in spectrum peak were attributable to damage to the Alq3 films caused in the process of forming the ITO films, but there was no clear difference in spectra among the ITO films formed by the different methods.

By performing peak fitting of the spectra, composition ratios of the thin films so formed were calculated. Samples were: (1) an Alq3 film and a 2 nm thick ITO film formed on the Alq3 film by plasma gun deposition; (2) an Alq3 film and a 2 nm thick ITO film formed on the Alq3 film by magnetron sputtering; (3) an Alq3 film and a 2 nm thick ITO film formed on the Alq3 film by facing target sputtering; (4) an Alq3 film and a 2 nm thick aluminum (Al) film formed on the Alq3 film by vapor deposition; and (5) an Alq3 film on which an ITO film is not formed. The results are as follows.

TABLE 3

| Sample | C | N | O | Al | Si | In | Sn |
|---|---|---|---|---|---|---|---|
| Alq3 ITO plasma deposition 2 nm | 48 | 2 | 30 | — | — | 18 | 2 |
| Alq3 ITO magnetron sputtering 2 nm | 47 | 2 | 29 | — | — | 16 | 6 |
| Alq3 ITO facing target sputtering 2 nm | 43 | 2 | 31 | — | — | 17 | 6 |
| Alq3 Al plasma deposition 2 nm | 46 | 2 | 35 | 18 | — | — | — |
| Alq3 without ITO | 35 | 2 | 50 | 3 | 10 | — | — |

(atom %)

Referring to Table 3, there was no clear difference in composition ratio of atoms among the ITO films formed by different methods.

The inventors focused on the fact that there was no clear difference among the ITO films formed by different methods and under different conditions in evaluating the ITO films and the organic functional layers as shown in FIGS. 15A-15C, 16A-16C, 17A-17C, 18A-18C, 19A, 19B, and Table 3 shown above. The inventors examined the possibility of manufacturing an organic electroluminescent element having high properties, such as a drive voltage and an element lifetime, by forming an ITO layer by sputtering in a high energy process, thereby increasing adhesion between the ITO layer and the organic functional layer. Formation of the ITO layer by sputtering in a high energy process is avoided in conventional technology to prevent degradation of properties, such as a drive voltage and element lifetime, of the organic electroluminescent element.

In forming the ITO layer, magnetron sputtering or facing target sputtering is typically used. The inventors examined which one of magnetron sputtering and facing target sputtering is suitable as a method for forming an electrode on an organic functional layer.

First, ion currents, which indicate the amount of ion of a sputtering gas that a film-forming substrate is irradiated with, and energy of the ion of the sputtering gas in magnetron sputtering and facing target sputtering were measured by plasma diagnosis using a probe method. The plasma diagnosis using the probe method refers to technique of measuring plasma characteristics by inserting a needle-like electrode (probe) into plasma, and measuring currents flowing through the probe.

Figure 20:
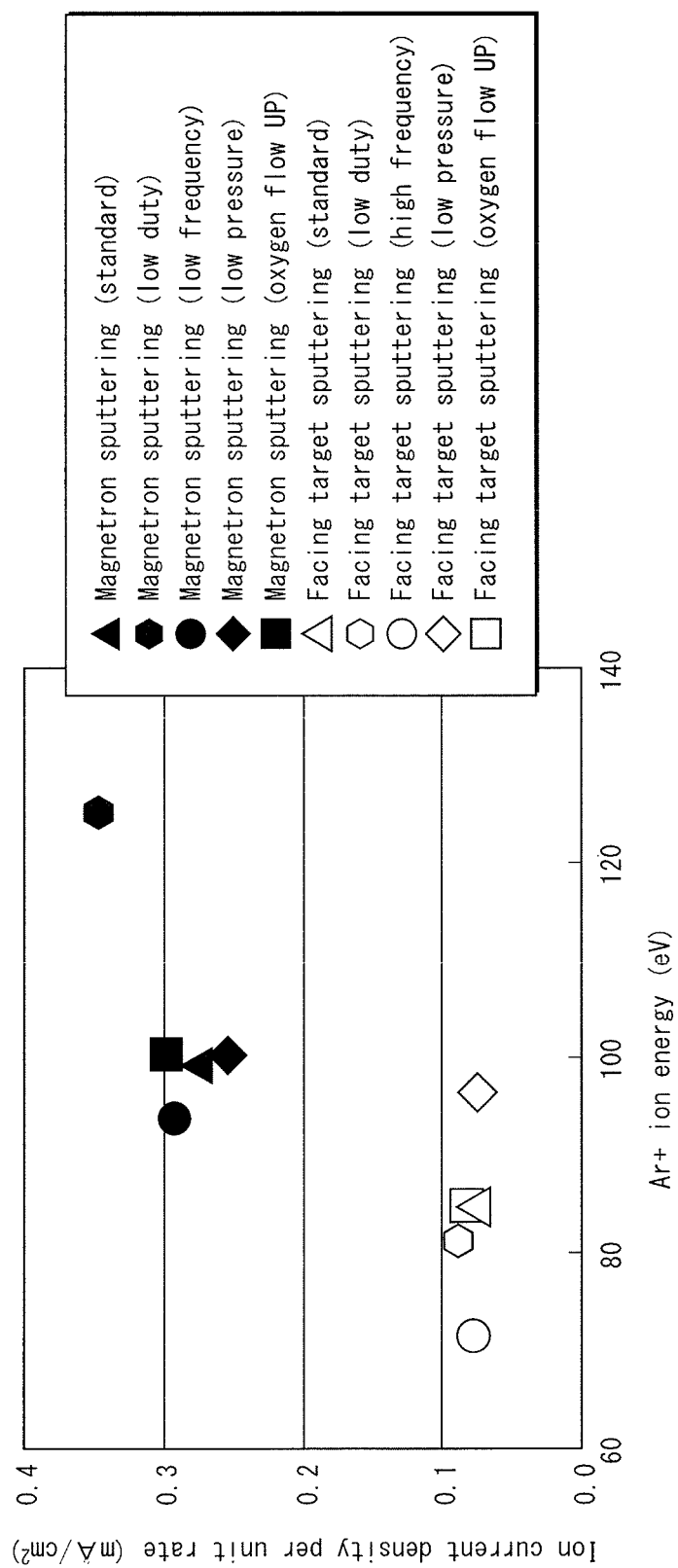
FIG. 20 shows measurement results of plasma characteristics.

FIG. 20 shows measurement results of the plasma characteristics. Details of the measurement results of the plasma characteristics are shown in the following table.

TABLE 4

| method | process condition | dynamic rate (Åm/min.) | dynamic rate (nm · m/sec.) | Ar ion energy (eV) | $O_2$ ion energy (eV) | ion current (mA/cm$^2$) | ion current density per unit rate |
|---|---|---|---|---|---|---|---|
| magnetron sputtering | standard | 911.92 | 1.519866667 | 99.2 | 133.26 | 0.42 | 0.27634 |
| | low duty | 901.1 | 1.501833333 | 125 | 201.73 | 0.53 | 0.35290 |
| | low frequency | 985.11 | 1.64185 | 93.8 | 124.48 | 0.48 | 0.29235 |
| | low pressure | 967.15 | 1.611916667 | 100.3 | 135.76 | 0.41 | 0.25436 |
| | oxygen flow UP | 944.76 | 1.5746 | 100.4 | 132.09 | 0.47 | 0.29849 |
| facing target sputtering | standard | 76.16 | 0.131933333 | 84.61 | 124.19 | 0.01 | 0.07580 |
| | low duty | 68.15 | 0.113583333 | 81.39 | 134.47 | 0.01 | 0.08804 |
| | high frequency | 76.09 | 0.126816667 | 71.61 | 105.99 | 0.01 | 0.07885 |
| | low pressure | 81.22 | 0.135366667 | 96.39 | 141.28 | 0.01 | 0.07387 |
| | oxygen flow UP | 75.55 | 0.125916667 | 84.87 | 124.78 | 0.01 | 0.07942 |

The plasma characteristics on a film-forming substrate were measured herein by inserting a probe into a position where the film-forming substrate exists. The horizontal axis is energy of collision of Ar ion (Ar+ ion energy) with the film-forming substrate. The vertical axis is ion current per unit dynamic rate. The ion current refers to a value of current generated when plasma flows into the probe. The ion current per unit dynamic rate on the vertical axis of FIG. 20 refers to quantified ion incident on the film-forming substrate, which is obtained by dividing the ion current by a dynamic rate (a film formation speed (Åm/min) when the film-forming substrate passes under the target at a transport speed of 1 m/min).

Each of the conditions during film formation is the same as that shown in Table 1 described above.

Referring to FIG. 20, the ion current density per unit dynamic rate, which indicates the amount of ion incident on the film-forming substrate, is higher in magnetron sputtering than in facing target sputtering under any of the conditions during film formation. Specifically, the ion current density per unit dynamic rate in magnetron sputtering is in a range of 0.2 mA/cm$^2$ to 0.4 mA/cm$^2$ inclusive.

For example, when facing target sputtering under a low pressure condition is compared with magnetron sputtering under a standard condition, the Ar+ ion energies are equivalent, but the ion current density per unit dynamic rate in magnetron sputtering under the standard condition is approximately three times higher than that in facing target sputtering under the low pressure condition. In this case, energy accumulated on the film-forming substrate in magnetron sputtering under the standard condition is approximately three times greater than that in facing target sputtering under the low pressure condition.

Ar ion of a sputtering gas incident on the film-forming substrate provides sputtered atoms adhering to the film-forming substrate with kinetic energy. This causes the sputtered atoms to more firmly adhere to the organic functional layer, and be accumulated on the organic functional layer. As a result, a dense thin firm can be formed.

The experimental results show that it is preferred that the ion current density per unit dynamic rate be in a range of 0.2 mA/cm$^2$ to 0.4 mA/cm$^2$ inclusive when the upper electrode is formed in the method for manufacturing the organic electroluminescent element according to the present embodiment.

In the method for manufacturing the organic electroluminescent element according to the present embodiment, the inventors focused on the effects of the ion of the sputtering gas incident on the film-forming substrate on adhesion between the ITO layer and the organic functional layer, and focused more on magnetron sputtering, which has a greater energy accumulated on the film-forming substrate than facing target sputtering, rather than on facing target sputtering.

The inventors further formed ITO films by facing target sputtering and magnetron sputtering under different conditions, and checked differences in profile of upper surfaces of the ITO films by observing the profiles of the upper surfaces of the ITO films under the scanning electron microscope (SEM).

FIGS. 21A-21F show SEM photographs of the ITO films formed by facing target sputtering. The SEM photographs of FIGS. 21A, 21B, 21C, 21D, and 21F show ITO films formed under the conditions shown in Table 2. The SEM photograph of FIG. 21E shows an ITO film formed under the standard condition shown in Table 2 except that a condition indicating a power is changed so as to indicate a power of 1.25 kw, which is half of a power of 2.5 kw.

Referring to FIGS. 21A-21F, carcass (agglomerate) particles were observed in facing target sputtering under conditions other than the standard condition.

FIGS. 22A-22F show SEM photographs of ITO films formed by magnetron sputtering. The SEM photographs of FIGS. 22A, 22B, 22C, 22D, and 22F show ITO films formed under the conditions shown in Table 1. The SEM photograph of FIG. 22E shows an ITO film formed under the standard condition shown in Table 1 except that a condition indicating a power is changed so as to indicate a power of 2.7 kw, which is half of a power of 5.4 kw.

Referring to FIGS. 22A-22F, in magnetron sputtering, substructures in which grains are combined one another were observed, and it was found that a dense thin film was formed under each of the conditions.

Crystallinity of the ITO films formed by magnetron sputtering and facing target sputtering was also analyzed by X-ray diffraction.

Figure 23:
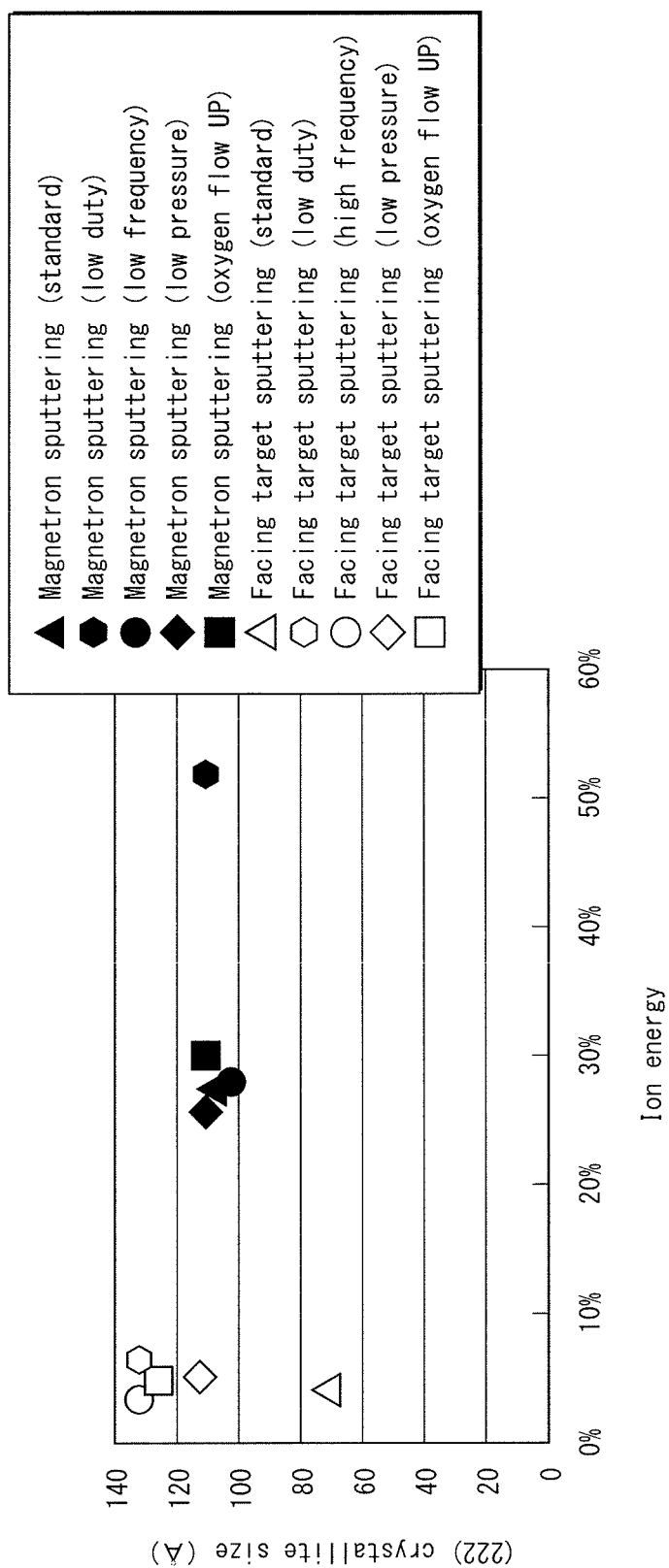
FIG. 23 shows measurement results of crystal sizes of ITO films.

FIG. 23 shows measurement results of crystal sizes of the ITO films. The ITO films were formed by sputtering under the same conditions as those shown in FIG. 20, and the crystal sizes of the ITO films were calculated from full width at half maximum (FWHM) of (222) diffraction lines by using the Scherrer equation. The Scherrer equation is as follows.

$$D = \frac{0.94\lambda}{\beta \cdot \cos\theta} \quad \text{[Math 4]}$$

In the above-mentioned equation, D denotes a crystallite size, λ denotes an X-ray wavelength, β denotes a peak width, and θ denotes a Bragg angle of a diffraction line.

Referring to FIG. 23, the crystallite size of the ITO film formed by facing target sputtering varies depending on the conditions, whereas variability in crystallite size was not observed in the ITO films formed by magnetron sputtering.

Figure 24:
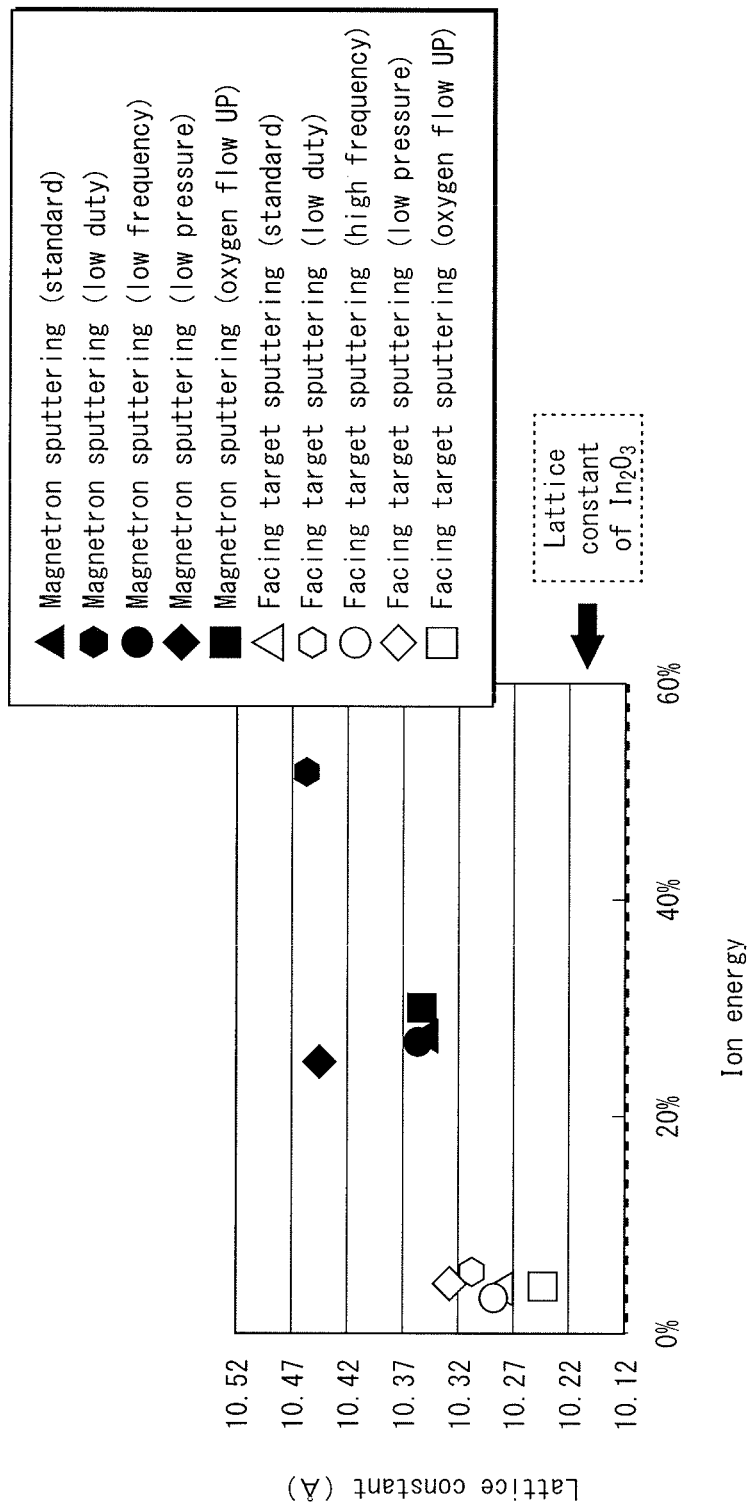
FIG. 24 shows measurement results of lattice constants of crystals of ITO films.

FIG. 24 shows measurement results of lattice constants of crystals of ITO films. The ITO films were formed by sputtering under the same conditions as those shown in FIG. 20, and the lattice constants of the ITO films were calculated from peak positions of (222) diffraction lines. The following describes the equation used to calculate the lattice constants.

$$a = d\sqrt{h^2 + k^2 + l^2}$$ [Math 5]

In the above-mentioned equation, "a" denotes a lattice constant, "d" denotes lattice spacing obtained by using Bragg's law, and "h", "k", and "l" denote plane indices.

Referring to FIG. 24, since the lattice constants of the ITO films formed by magnetron sputtering and by facing target sputtering are larger than a lattice constant of 10.118 Å of $In_2O_3$ (ITO), crystal strain was observed in the ITO films formed by sputtering. The results show that the crystal strain is larger in the ITO films formed by magnetron sputtering than in the ITO films formed by facing target sputtering. This is attributable to the fact that the amount of Ar ion incident on the film-forming substrate is larger in the ITO films formed by magnetron sputtering than in the ITO films formed by facing target sputtering.

The above-mentioned experimental results led the inventors into the idea that adhesion between an electrode layer and an organic functional layer can be increased by forming the upper electrode film on the organic functional layer by magnetron sputtering in a high energy process, in which energy of the ion of the sputtering gas incident on the film-forming substrate is greater than that in facing target sputtering, and thus an organic electroluminescent element having high properties, such as a drive voltage and an element lifetime, can be manufactured. That is to say, it is preferred to form the cathode having a high flatness and included in the organic electroluminescent element in the present embodiment by magnetron sputtering with a power density of between 4.5 W/cm² and 9.0 W/cm² inclusive.

When the cathode included in the organic electroluminescent element in the present embodiment is formed by magnetron sputtering, it is preferred that the ambient gas pressure be 0.4 Pa or higher from the standpoint of takt time in the process of manufacturing the organic electroluminescent element, and be 1.6 Pa or lower from the standpoint of a value of the sheet resistance of the electrode layer. If the ambient gas pressure is too high, the value of the sheet resistance of the electrode layer becomes too high.

The experimental results in FIG. 20 show that it is preferred that the ion current density per unit dynamic rate be in a range of 0.2 mA/cm² to 0.4 mA/cm² inclusive when the cathode included in the organic electroluminescent element in the present embodiment is formed by magnetron sputtering.

The distance between the target and the film-forming substrate when the cathode included in the organic electroluminescent element in the present embodiment is formed by magnetron sputtering is, for example, 50 mm to 80 mm inclusive.

The Ar gas flow when the cathode included in the organic electroluminescent element in the present embodiment is formed by magnetron sputtering is, for example, 100 sccm to 500 sccm inclusive.

The $O_2$ gas flow when the cathode included in the organic electroluminescent element in the present embodiment is formed by magnetron sputtering is, for example, 5 sccm to 25 sccm inclusive.

The pulse frequency of current applied to the target when the cathode included in the organic electroluminescent element in the present embodiment is formed by magnetron sputtering is, for example, 100 kHz to 500 kHz inclusive.

The following describes measurement of the driving efficiency and the element lifetime of the organic electroluminescent element manufactured by forming the electrode by magnetron sputtering in a high energy process to confirm utility of magnetron sputtering in a high energy process.

Figure 25:
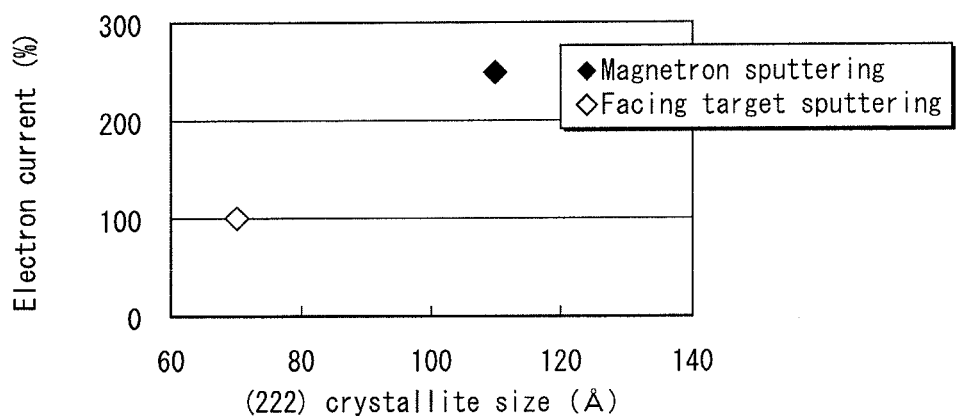
FIG. 25 shows values of current flowing when a voltage of 5V is applied to organic electroluminescent elements.

FIG. 25 shows values of current flowing when a voltage of 5 V is applied to organic electroluminescent elements. The organic electroluminescent elements are manufactured by forming ITO electrodes on respective organic functional layers by magnetron sputtering and facing target sputtering. Conditions during film formation by magnetron sputtering and facing target sputtering are the same as the standard condition shown in Table 1. That is to say, the power density in magnetron sputtering is 9.0 W/cm². The electron current shown on the vertical axis is a value of the electron current relative to a value of the electron current of the organic electroluminescent element manufactured by forming the ITO electrode by facing target sputtering.

Referring to FIG. 25, upon application of the same voltage, larger current flows through the electroluminescent element manufactured by forming the ITO film on the organic functional layer by magnetron sputtering in a high energy process. This shows that the organic electroluminescent element manufactured by forming the electrode layer on the organic functional layer by magnetron sputtering in a high energy process has high electron injection properties from the electrode into the organic functional layer, and has a high driving efficiency.

Figure 26:
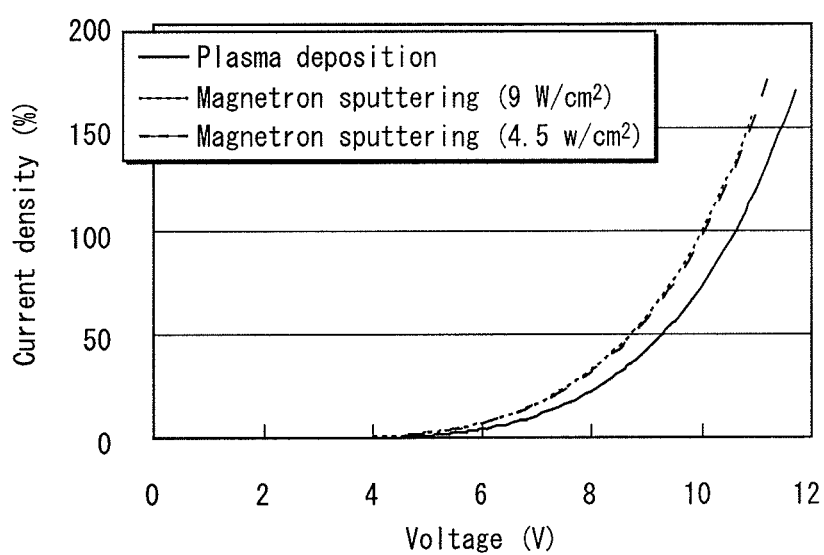
FIG. 26 shows relations between voltage and current density of organic electroluminescent elements.

FIG. 26 shows relations between voltage and current density of organic electroluminescent elements. The organic electroluminescent elements are manufactured by forming ITO films on respective organic functional layers by plasma deposition, magnetron sputtering with a power density of 9.0 W/cm², and magnetron sputtering with a power density of 4.5 W/cm². Conditions during film formation by plasma gun deposition and magnetron sputtering with a power density of 9.0 W/cm² are the same as the standard condition shown in Table 1. A condition during film formation by magnetron sputtering with a power density of 4.5 W/cm² is the standard condition shown in Table 1 except that a condition indicating a power is changed so as to indicate a halved power. The current density shown on the vertical axis is a value of the current density relative to a value of the current density of the organic electroluminescent element manufactured by forming the ITO electrode by magnetron sputtering with a power density of 9.0 W/cm², and a voltage of 10 V is applied to the organic electroluminescent element thus manufactured.

Referring to FIG. 26, the organic electroluminescent element manufactured by forming the ITO film on the organic functional layer by magnetron sputtering with a power density of 9.0 W/cm² and the organic electroluminescent element manufactured by forming the ITO film on the organic functional layer by magnetron sputtering with a power density of 4.5 W/cm² have higher electron injection properties from the electrode into the organic functional layer and a higher driving efficiency than the organic electroluminescent element manufactured by forming the ITO film on the organic functional layer by plasma deposition, which is said to cause low damage.

The experimental results show that it is preferred to form the cathode included in the organic electroluminescent element in the present embodiment by magnetron sputtering with a power density of between 4.5 W/cm² and 9.0 W/cm² inclusive.

Figure 27:
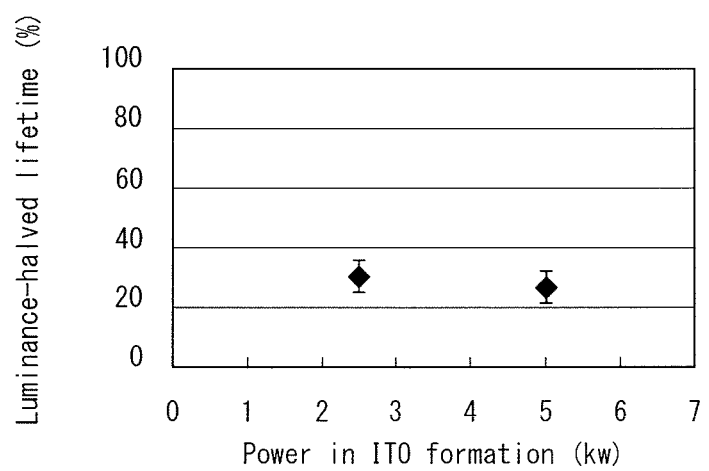
FIG. 27 shows measurement results of luminance-halved lifetimes of organic electroluminescent elements manufactured by forming ITO films on organic functional layers by facing target sputtering.

FIG. 27 shows measurement results of luminance-halved lifetimes of organic electroluminescent elements manufactured by forming ITO films on respective organic functional layers by facing target sputtering. The luminance-halved lifetime shown on the vertical axis is a luminance-halved lifetime relative to a luminance-halved lifetime of the organic electroluminescent element manufactured by forming the ITO film on the organic functional layer by magnetron sputtering with a power density of 9.0 W/cm$^2$. Referring to FIG. 27, the luminance-halved lifetimes of the organic electroluminescent elements manufactured by forming the ITO films by facing target sputtering do not improve even when the power increases. Presumably, this is because, in facing target sputtering, adhesion between the organic functional layer and the electrode layer cannot be increased due to a small amount of ion of a sputtering gas incident on the film-forming substrate, and thus the electron injection properties from the electrode into the organic functional layer cannot be improved.

Figure 28:
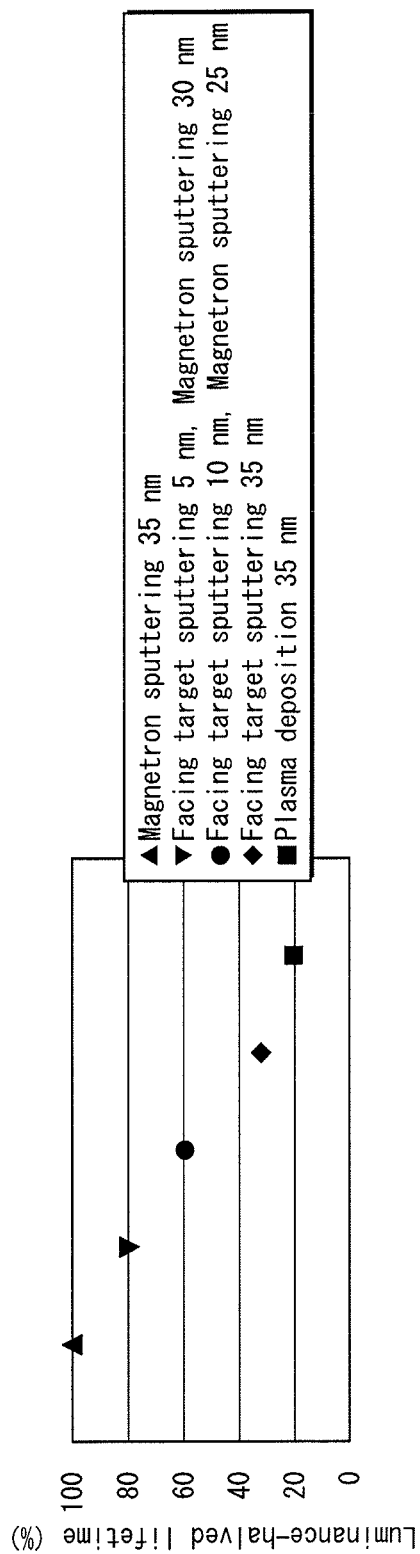
FIG. 28 shows measurement results of luminance-halved lifetimes of organic electroluminescent elements manufactured by forming ITO films on organic functional layers by magnetron sputtering, facing target sputtering, and plasma deposition.

FIG. 28 shows measurement results of luminance-halved lifetimes of organic electroluminescent elements manufactured by forming ITO films on respective organic functional layers by magnetron sputtering, facing target sputtering, and plasma deposition. The luminance-halved lifetime shown on the vertical axis is a luminance-halved lifetime relative to a luminance-halved lifetime of an organic electroluminescent element manufactured by forming a 35 nm thick ITO film on an organic functional layer by magnetron sputtering.

Samples are: (1) an organic electroluminescent element manufactured by forming a 35 nm thick ITO film on an organic functional layer by magnetron sputtering; (2) an organic electroluminescent element manufactured by forming, on an organic functional layer, a 5 nm thick ITO film by facing target sputtering, and then a 30 nm thick ITO film by magnetron sputtering; (3) an organic electroluminescent element manufactured by forming, on an organic functional layer, a 10 nm thick ITO film by facing target sputtering, and then a 25 nm thick ITO film by magnetron sputtering; (4) an organic electroluminescent element manufactured by forming a 35 nm thick ITO film on an organic functional layer by facing target sputtering; and (5) an organic element manufactured by forming a 35 nm thick ITO film on an organic functional layer by plasma deposition.

Conditions during film formation by magnetron sputtering, facing target sputtering, and plasma deposition are the same as the standard condition shown in Table 1. That is to say, the power density in magnetron sputtering is 9.0 W/cm$^2$.

Referring to FIG. 28, the organic electroluminescent element manufactured by forming the electrode on the organic functional layer by magnetron sputtering with a power density of 9.0 W/cm$^2$ has higher lifetime properties than the organic electroluminescent elements manufactured by forming the electrodes on the respective organic functional layers by plasma deposition and facing target sputtering.

Presumably, this is because adhesion between the organic functional layer and the upper electrode is increased by forming the upper electrode by magnetron sputtering in a high energy process, in which the amount of ion of a sputtering gas incident on the organic functional layer is large.

Further, a high-efficient, long-lived organic electroluminescent element having high electron injection properties from the upper electrode into the organic functional layer can be manufactured, presumably because damage to the organic functional layer as the underlayer caused by formation of the cathode by magnetron sputtering in a high energy process is not observed, and adhesion between the cathode and the organic functional layer increases.

It is also found that the organic electroluminescent elements each manufactured by forming, on the organic functional layer, an electrode by facing target sputtering, and then another electrode by magnetron sputtering with a power density of 9.0 W/cm$^2$ have higher lifetime properties than the organic electroluminescent elements manufactured by forming the electrodes on the respective organic functional layers by plasma deposition and facing target sputtering.

The results show that the organic electroluminescent element having high lifetime properties can be manufactured by using magnetron sputtering in a high energy process in the process of forming the upper electrode.

Referring to the experimental results shown in FIG. 25, the organic electroluminescent element manufactured by forming the ITO film on the organic functional layer by magnetron sputtering with a power density of 9.0 W/cm$^2$ has approximately equivalent electron injection properties from the electrode into the organic functional layer to those of the organic electroluminescent element manufactured by forming the ITO film on the organic functional layer by magnetron sputtering with a power density of 4.5 W/cm$^2$. It is therefore considered that the organic electroluminescent element manufactured by forming the ITO film on the organic functional layer by magnetron sputtering with a power density of 4.5 W/cm$^2$ also has high lifetime properties as in the organic electroluminescent element manufactured by forming the ITO film on the organic functional layer by magnetron sputtering with a power density of 9.0 W/cm$^2$.

SUMMARY

In summary, when the profile of the upper surface of the cathode has a high flatness, specifically when the profile of the upper surface of the cathode has a skewness of between −0.5 and 0.7 inclusive, an upper electrode film having few spaces therein is formed on the electron transport layer, intrusion of oxygen and the material for the electrode into the electron transport layer can be suppressed, and thus an organic electroluminescent element having excellent device performance, such as an element lifetime and light-emitting efficiency, can be provided. The cathode having the upper surface whose profile has the above-mentioned skewness can be formed, for example, by magnetron sputtering in a high energy process.

[Supplementary Remarks]

Description has been made so far based on the above-mentioned embodiment, but the present invention is in no way limited to the above-mentioned embodiment. The following modifications also fall within a scope of the present invention.

(1) In the above-mentioned embodiment, the organic electroluminescent element includes the cathode, the electron transport layer, the light-emitting layer, the hole transport layer, the hole injection layer, the anode, and the substrate. The present invention, however, is not limited to this structure. As long as the organic electroluminescent element includes an electrode pair composed of the upper electrode and the lower electrode, and one or more organic functional layers interposed between the upper electrode and the lower electrode, the organic electroluminescent element may include, as an organic functional layer, a functional layer other than the functional layers listed herein.

For example, an electron injection layer for promoting injection of electrons from the cathode into the electron transport layer may be provided between the cathode and the electron transport layer. Examples of a material for the electron injection layer are low work function metal such as lithium, barium, calcium, potassium, cesium, sodium and rubidium, low work function metal salt such as lithium fluoride, and low work function metal oxide such as barium oxide. When the cathode is made of ITO, however, desired electron injection properties cannot be obtained as the electron injection layer is oxidized. It is therefore necessary to set a condition such that an Al film is formed prior to the ITO cathode, or the above-mentioned material for the electron injection layer is mixed with an organic material, for example.

The organic electroluminescent element may not include one or more of the functional layers listed herein.

(2) The magnetron sputtering device shown in FIG. 14 is just an example, and magnetron sputtering according to the present invention is not limited to that using the magnetron sputtering device shown in FIG. 14. Magnetron sputtering is a method of applying a magnetic field to a target, capturing secondary electrons dislodged from the target by collision with a surface of the target by using Lorentz force generated by the magnetic field, and causing the secondary electrons to make a cycloidal or trochoidal motion to generate high-density plasma in the vicinity of the target.

INDUSTRIAL APPLICABILITY

The organic electroluminescent element according to the present invention is applicable as organic electroluminescent elements for use in various display devices, television devices, displays for portable electronic devices, and the like for household use, public use, and business use.

REFERENCE SIGNS LIST

100 organic electroluminescent element
101 cathode
102 electron transport layer
103 light-emitting layer
104 hole transport layer
105 hole injection layer
106 anode
107 substrate
1400 magnetron sputtering device
1401 sputtering chamber
1402 gas supply system
1403 exhaust system
1404 backing plate
1405 target
1406 magnet
1407 mount
1408 film-forming substrate
1409 power supply

The invention claimed is:

1. An organic electroluminescent element, comprising:
a lower electrode;
an organic functional layer on the lower electrode; and
an upper electrode on the organic functional layer, the upper electrode having a crystalline structure, wherein
profile of an upper surface of the upper electrode has a kurtosis of between −0.7 and 0.3 inclusive,
oxygen is distributed in the organic functional layer, the oxygen being distributed from an interface with the upper electrode to a depth of no more than 18 nm,
the upper electrode has been formed by magnetron sputtering with an ion current density per unit dynamic rate being in a range of 0.2 mA/cm$^2$ to 0.4 mA/cm$^2$ inclusive,
the upper electrode has been formed by the magnetron sputtering with a distance between a target and a film-forming substrate being 50 mm to 80 mm inclusive,
the upper electrode has been formed by the magnetron sputtering with an inert gas flow being in a range of 100 sccm to 500 sccm inclusive,
the upper electrode has been formed by the magnetron sputtering with an oxygen gas flow being in a range of 5 sccm to 25 sccm inclusive,
the upper electrode has been formed by the magnetron sputtering with a pulse frequency of current applied to the target being in a range of 100 kHz to 500 kHz inclusive, and
the upper electrode has been formed by the magnetron sputtering with a duty ratio being in a range of 60% to 73% inclusive.

2. The organic electroluminescent element of claim 1, wherein
the upper electrode has been formed by magnetron sputtering with an ambient gas pressure being in a range of 0.4 Pa to 1.0 Pa inclusive.

3. The organic electroluminescent element of claim 2, wherein
the upper electrode has been formed by the magnetron sputtering with the ambient gas pressure being in a range of 0.4 Pa to 0.6 Pa inclusive.

4. The organic electroluminescent element of claim 1, wherein
the oxygen is distributed in the organic functional layer from the interface with the upper electrode to a depth of 15 nm to 18 nm.

5. The organic electroluminescent element of claim 1, wherein
a material of the upper electrode is distributed in the organic functional layer, the material being distributed from the interface with the upper electrode to a depth of 12 nm to 15 nm.

6. The organic electroluminescent element of claim 1, wherein
the organic functional layer is composed of a plurality of layers including an electron transport layer,
the lower electrode is an anode, and
the upper electrode is a cathode, and is in contact with the electron transport layer.

7. The organic electroluminescent element of claim 6, wherein
the upper electrode is made of a light-transmissive electrically-conductive material.

8. The organic electroluminescent element of claim 7, wherein
the upper electrode is made of an oxide containing at least one selected from the group consisting of In, Ti, Zn, and Sn.

9. The organic electroluminescent element of claim 1, wherein
the profile of the upper surface of the upper electrode has a skewness of between −0.5 and 0.7 inclusive.

10. The organic electroluminescent element of claim 1, wherein
the upper electrode has been formed by magnetron sputtering with a power density of between 4.5 W/cm$^2$ and 9.0 W/cm$^2$ inclusive.

11. A method for manufacturing an organic electroluminescent element comprising:
forming a lower electrode on a substrate;
forming an organic functional layer on the lower electrode; and forming an upper electrode on the organic functional layer by magnetron sputtering with an ambient gas pressure being in a range of 0.4 Pa to 1.0 Pa inclusive so that profile of an upper surface of the upper electrode has a kurtosis of between −0.7 and 0.3 inclusive, the upper electrode having a crystalline structure, wherein in the forming of the upper electrode, oxygen is distributed in the organic functional layer, the oxygen being distributed from an interface with the upper electrode to a depth of no more than 18 nm, the upper electrode is formed by the magnetron sputtering with an ion current density per unit dynamic rate being in a range of 0.2 mA/cm$^2$ to 0.4 mA/cm$^2$ inclusive, the upper electrode is formed by the magnetron sputtering with a distance between a target and a film-forming substrate being 50 mm to 80 mm inclusive, the upper electrode is formed by the magnetron sputtering with an inert gas flow being in a range of 100 sccm to 500 sccm inclusive, the upper electrode is formed by the magnetron sputtering with an oxygen gas flow being in a range of 5 sccm to 25 sccm inclusive, the upper electrode is formed by the magnetron sputtering with a pulse frequency of current applied to the target being in a range of 100 kHz to 500 kHz inclusive, and the upper electrode is formed by the magnetron sputtering with a duty ratio being in a range of 60% to 73% inclusive.

12. The method of claim 11, wherein
the upper electrode has been formed by the magnetron sputtering with the ambient gas pressure being in a range of 0.4 Pa to 0.6 Pa inclusive.

13. The method of claim 11, wherein
the oxygen is distributed in the organic functional layer from the interface with the upper electrode to a depth of 15 nm to 18 nm.

14. The method of claim 11, wherein
in the forming of the upper electrode, a material of the upper electrode is distributed in the organic functional layer, the material being distributed from the interface with the upper electrode to a depth of 12 nm to 15 nm.

15. The method of claim 11, wherein
the profile of the upper surface of the upper electrode has a skewness of between −0.5 and 0.7 inclusive.

16. The method of claim 11, wherein
the upper electrode has been formed by magnetron sputtering with a power density of between 4.5 W/cm$^2$ and 9.0 W/cm$^2$ inclusive.

* * * * *